(12) United States Patent
Pagani

(10) Patent No.: US 8,941,401 B2
(45) Date of Patent: Jan. 27, 2015

(54) TEST CIRCUIT OF AN INTEGRATED CIRCUIT ON A WAFER

(75) Inventor: Alberto Pagani, Nova Milanese (IT)

(73) Assignee: STMicroelectronics S.r.l., Agrate Brianza (IT)

(*) Notice: Subject to any disclaimer, the term of this patent is extended or adjusted under 35 U.S.C. 154(b) by 748 days.

(21) Appl. No.: 13/093,738

(22) Filed: Apr. 25, 2011

(65) Prior Publication Data

US 2011/0267086 A1    Nov. 3, 2011

(30) Foreign Application Priority Data

Apr. 29, 2010  (IT) .............................. MI2010A0744

(51) Int. Cl.
| | |
|---|---|
| G01R 31/303 | (2006.01) |
| G01R 31/307 | (2006.01) |
| G01R 31/317 | (2006.01) |
| G01R 31/28 | (2006.01) |
| G01R 31/26 | (2014.01) |
| G01R 31/302 | (2006.01) |
| G01R 31/3185 | (2006.01) |
| G01R 35/00 | (2006.01) |

(52) U.S. Cl.
CPC ...... *G01R 31/31716* (2013.01); *G01R 31/2884* (2013.01); *G01R 31/3025* (2013.01); *G01R 31/318511* (2013.01); *G01R 35/00* (2013.01)
USPC ............ 324/754.21; 324/762.01; 324/762.03; 324/762.05

(58) Field of Classification Search
CPC .............................. G01R 31/00; G01R 31/303
USPC .......... 324/537–538, 754.21, 750.01–757.05, 324/762.01–762.02
See application file for complete search history.

(56) References Cited

U.S. PATENT DOCUMENTS

| | | | |
|---|---|---|---|
| 5,136,247 A * | 8/1992 | Hansen ......................... | 324/457 |
| 6,232,790 B1 * | 5/2001 | Bryan et al. ............. | 324/754.07 |
| 7,880,490 B2 * | 2/2011 | Lee et al. .................... | 324/750.3 |

(Continued)

FOREIGN PATENT DOCUMENTS

| | | |
|---|---|---|
| JP | 2010028623 | 2/2010 |
| WO | 2007/038310 A1 | 4/2007 |

(Continued)

OTHER PUBLICATIONS

Bhattacharya et al., "A Built-In Loopback Test Methodology for RF Transceiver Circuits using Embedded Sensor Circuits," Proceedings of the 13$^{th}$ Asian Test Symposium, Nov. 2004, 6 pages.

(Continued)

*Primary Examiner* — Melissa Koval
*Assistant Examiner* — Emily Chan
(74) *Attorney, Agent, or Firm* — Seed IP Law Group PLLC

(57) ABSTRACT

A test circuit is described of a circuit integrated on wafer of the type comprising at least one antenna of the embedded type comprising at least one test antenna associated with said at least one embedded antenna that realizes its connection of the wireless loopback type creating a wireless channel for said at least one embedded antenna and allows its electric test, transforming an electromagnetic signal of communication between said at least one embedded antenna and said at least one test antenna into an electric signal that can be read by a test apparatus.

33 Claims, 20 Drawing Sheets

(56) References Cited

U.S. PATENT DOCUMENTS

| | | | |
|---|---|---|---|
| 2004/0048584 | A1 | 3/2004 | Vaidyanathan et al. ...... 455/103 |
| 2005/0138499 | A1* | 6/2005 | Pileggi et al. ................ 714/724 |
| 2006/0226864 | A1 | 10/2006 | Kramer ......................... 324/765 |
| 2007/0162801 | A1 | 7/2007 | Moore .......................... 714/724 |
| 2009/0033467 | A1* | 2/2009 | Finocchiaro et al. ........ 340/10.1 |
| 2009/0134903 | A1 | 5/2009 | Hsieh et al. .................. 324/765 |

FOREIGN PATENT DOCUMENTS

| | | |
|---|---|---|
| WO | 2009/034496 A2 | 3/2009 |
| WO | 2009/105885 A1 | 9/2009 |

OTHER PUBLICATIONS

Italian Search Report, completed Jan. 5, 2011, for Italian Publication No. MI20100744, 3 pages.

\* cited by examiner

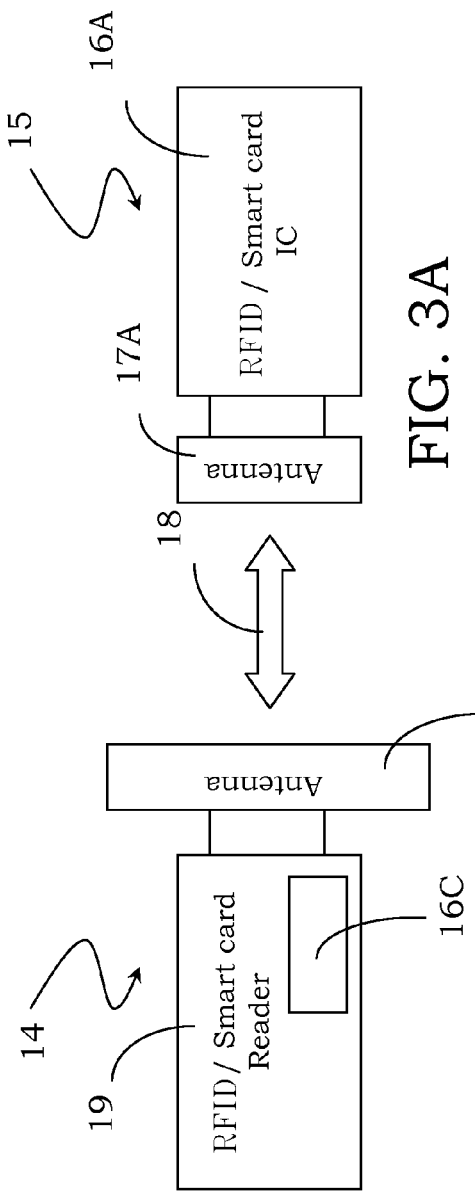
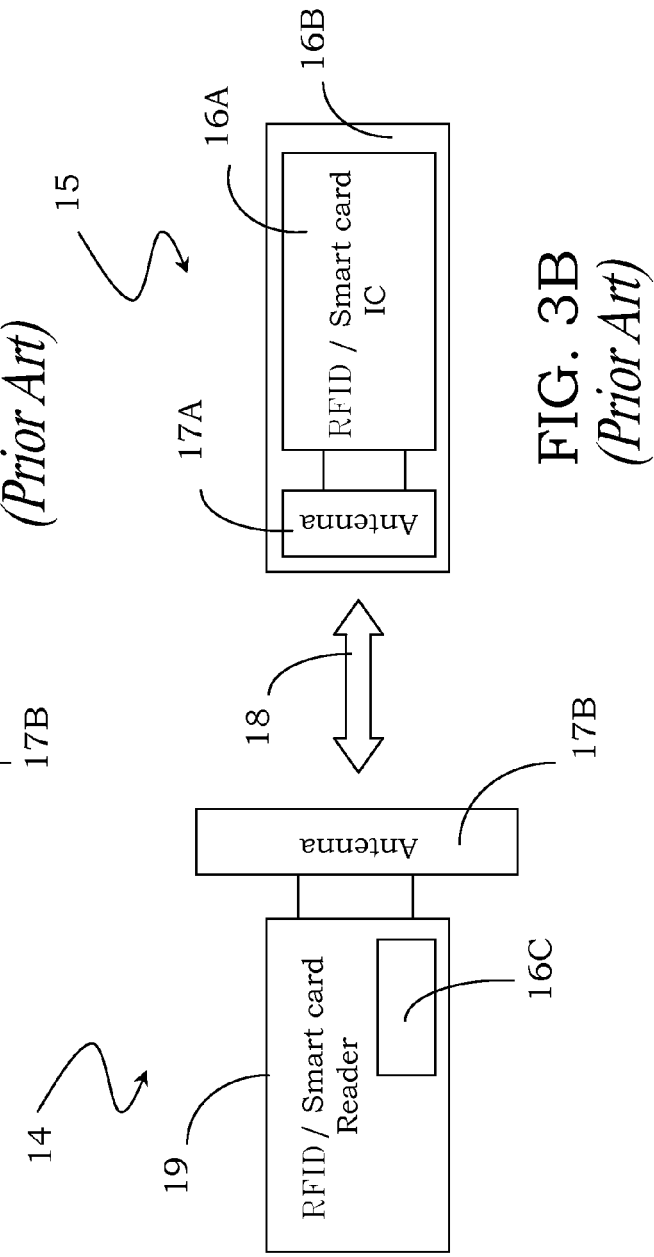
FIG. 3A (Prior Art)
FIG. 3B (Prior Art)

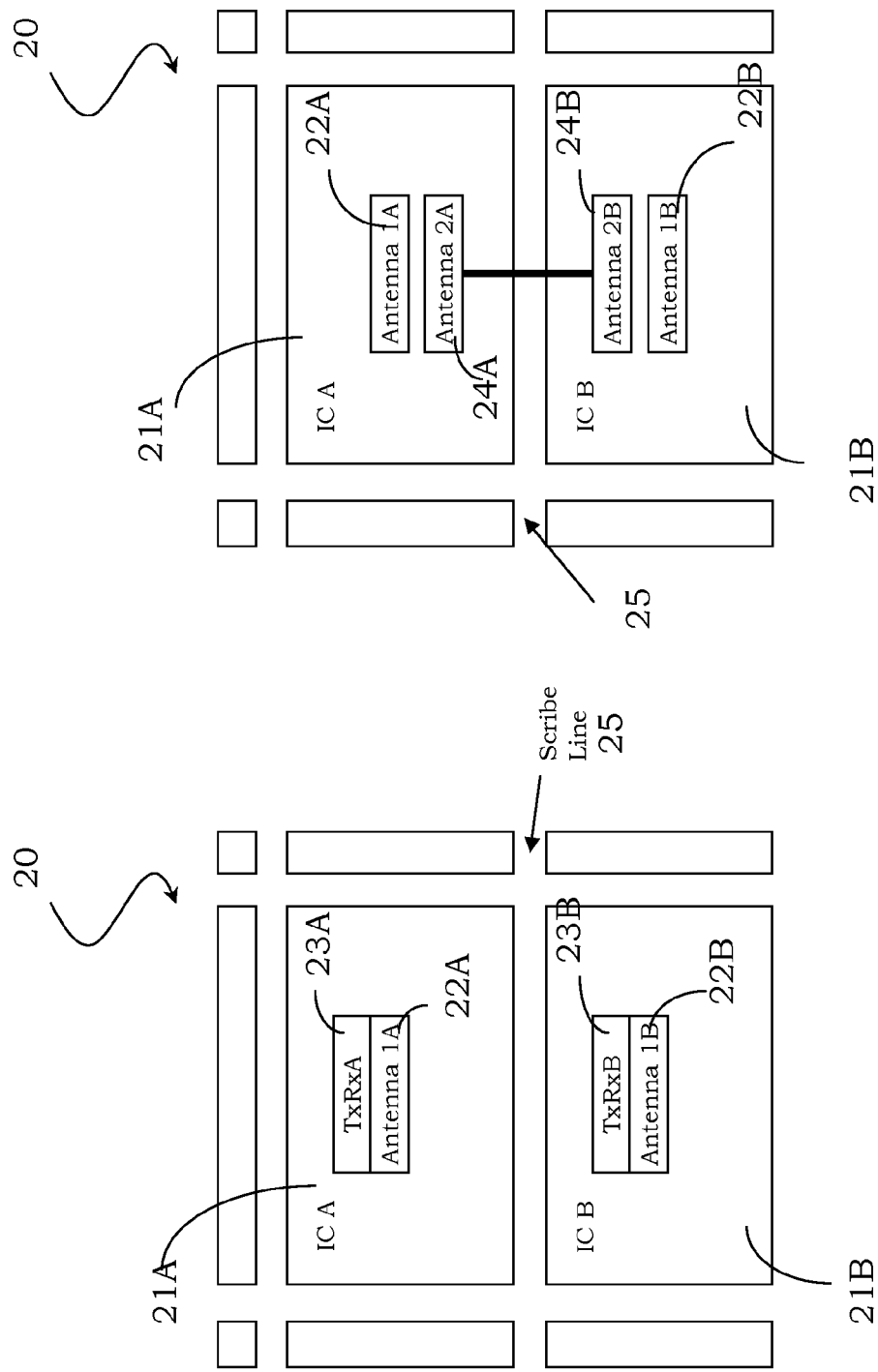

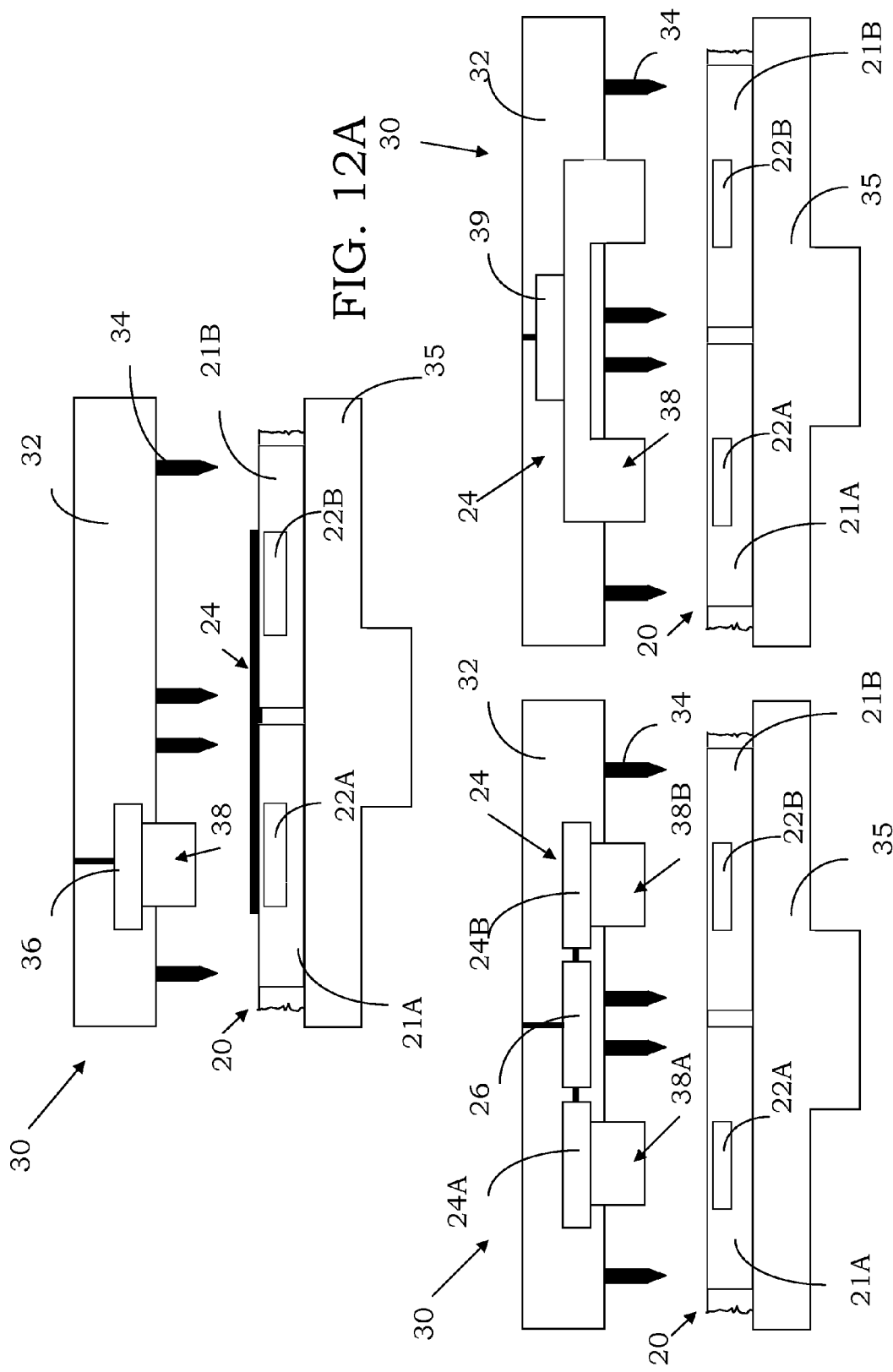

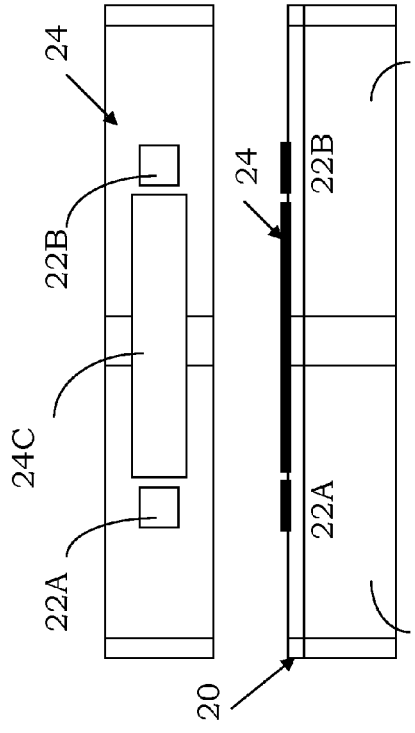
FIG. 17A
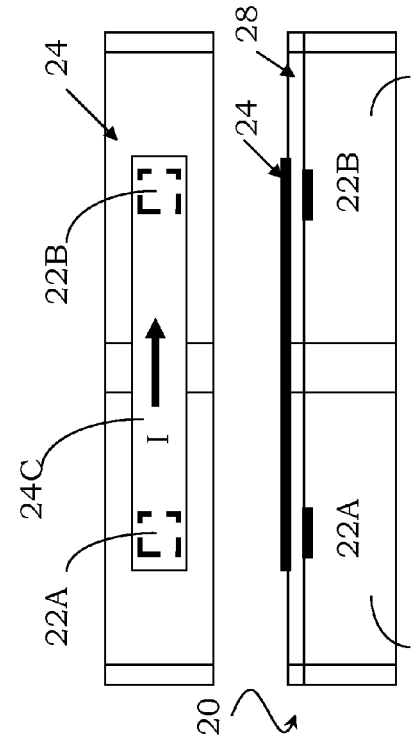
FIG. 17C
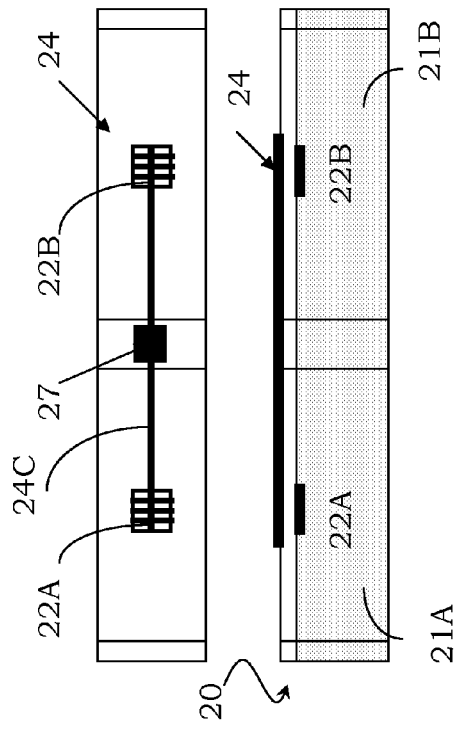
FIG. 17B
FIG. 17D

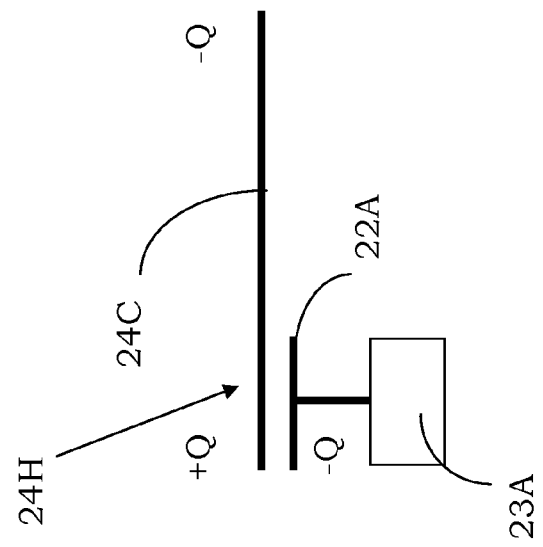
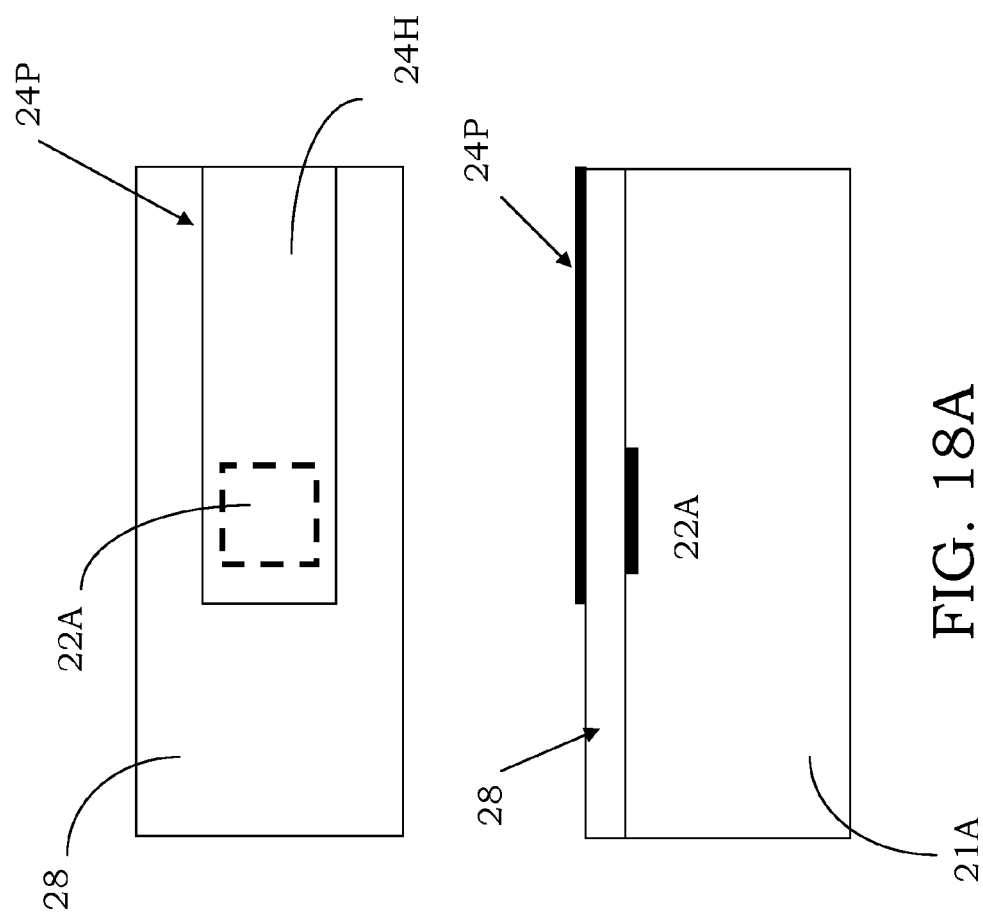
FIG. 18B
FIG. 18A

US 8,941,401 B2

TEST CIRCUIT OF AN INTEGRATED CIRCUIT ON A WAFER

BACKGROUND

1. Technical Field

The present disclosure relates to a test circuit of a circuit integrated on a wafer, such as an integrated circuit comprising at least one antenna of the embedded type.

2. Description of the Related Art

For the electric selection of devices carried out on wafer, i.e., the so called testing EWS (acronym of "Electrical-Wafer-Sorting"), a tester or ATE (acronym of "Automated Test Equipment") is electrically connected to and executes measures on a wafer whereon there are electronic components to be tested or selected, particular chip. A terminal portion of a test system is schematically shown in FIG. 1A, globally indicated with 1.

The interface between the tester ATE 1A and a wafer 6 comprising a plurality of devices to be tested or selected, in particular the chips 7 (also indicated as integrated circuits or IC, acronym of "Integrated Circuit") is a so called probe card 2, which is typically a board comprising a PCB (acronym of "Printed Circuit Board") and a Probe Head 3 that includes different hundreds (or several times thousands) of probes 4 that electrically connect the tester ATE 1A to almost all the contact pads 8 of a chip 7 to be tested, as shown in greater detail schematically in FIG. 1B. In particular, each end portion or tip 9 of the probes 4 comes in contact with a pad 8 of the chip 7.

In general, the wafer 6 groups a plurality of chips 7 to be tested, and during the testing steps it is put on a support called a chuck 5, shown in the portion of the test system 1, and belonging to an apparatus also called a prober (not shown in the figure), this support being thus also indicated as prober chuck.

The number of pads 8 used for a determined testing can be smaller or equal to the total number of pads 8 of the chip 7 to be tested.

In a similar way, one goes further even if on the chips 7 having contact bumps instead of pads 8.

Before each chip 7 is encapsulated in a corresponding package, the testing of the chip 7 itself is typically executed, the chip being still on wafer 6, using the probes 4 that are connected directly to the pads 8, and that thus execute the so called probing of the pad 8 they come in contact with.

After the testing, the wafer 6 is cut and the chips 7 that have been tested and result operating are assembled in their package, ready for further process steps, which also may comprise testing steps in the package wherein they have been assembled.

Similarly to the testing on wafer, the tester ATE is typically able to execute a final test or FT (acronym of "Final Test") of what is contained in the package comprising a given chip 7, electrically connecting to the connections of the package itself.

In the case of SiP systems (acronym of "System In Package") there can be other situations, even very complex, further to the creation of electric connections between the various parts (chips, passive components, PCB, . . . ) of the system.

A generic electronic system or chip may be connected to the surrounding world through connections such as cabled channels (for example: cables, optical fibers, . . . ) or wireless channels, for example of the electromagnetic type. These connections allow to exchange information signals and/or to supply power to the same chips.

In case magnetic or electromagnetic signals are to be exchanged between an integrated circuit IC and at least another external system, the integrated circuit IC should have at least one receiver/transmitter inside, also called transceiver/transponder, connected to at least one antenna that can be embedded in the integrated circuit IC itself, as schematically shown in FIG. 2.

As illustrated, the integrated circuit IC 10 comprises a plurality of circuit portions 11, also indicated as Core 1 . . . Core 4, at least one of which, as illustrated Core 1, is connected to an antenna 12 through a transceiver/transponder 13.

Examples of integrated circuits IC equipped with an antenna are the RFID circuits (acronym of "Radio Frequency Identification Device"), Smart Cards, etc., that typically are low power integrated circuits (low power IC), that can be supplied and exchange information by using electromagnetic waves through wireless channels (and thus without contact or contactless) that use an electromagnetic coupling obtained through at least two antennas, of the type schematically shown in FIGS. 3A and 3B.

The RFID circuit, globally indicated with 15, comprises an antenna 17A, that can be for example a magnetic dipole or a hertzian dipole, which is connected to an integrated circuit IC 16A (as illustrated, a RFID/Smart card IC) in general by using bumps or wire bonds. The antenna 17A and the integrated circuit IC 16A are in general both contained in a single package. The antenna 17A is connected to the integrated circuit IC 16A, and this antenna 17A can be external to the circuit IC 16A, as indicated in FIG. 3A, or it can be embedded, and thus be part of an overall integrated circuit 16B, as indicated in FIG. 3B, thus having a circuit with an On-Chip Antenna (OCA), of which a portion is the integrated circuit IC 16A.

The RFID circuit 15 communicates, by means of the exchange of electromagnetic waves 18, to an external system, for example a reader 14 that comprises an antenna 17B and a reading system (RFID/Smart card Reader) 19, comprising at least one integrated circuit 16C, for example having characteristics being compatible and functionally specular with respect to the integrated circuit 16A.

The antenna 17A of FIG. 3B of the RFID circuit 15 can be of the magnetic type, in particular of the near field inductive type, and can be positioned around the integrated circuit IC 16A, with an increase of the area of the integrated circuit IC 16B itself and a consequent reduction of the total number of RFID circuits that can find place on a wafer. Alternatively, the antenna 17A can also be placed above the integrated circuit IC 16A in order to avoid such an area increase.

In particular, a known process for creating an antenna of the integrated or embedded type is a traditional diffusion process, that however uses additional masks and additional steps with respect to the wafer manufacturing process. Post processing methodologies are also able to create embedded antennas at lower costs.

In any case, the antennas of the embedded type, nowadays very used for RFID or Smart Cards, have a limited reach due to their sizes.

Antennas of the capacitive type are also known, that use the generic pad of an integrated circuit IC as an armature of a capacitor.

BRIEF SUMMARY

One of the problems tied to the use of at least one embedded antenna in an integrated circuit on wafer is the testing of the antenna itself, i.e., the problem is that of demonstrating that it works starting from the wafer that contains the integrated circuit equipped with the antenna and a plurality of other integrated circuits.

In particular, the testing that uses the probing on pad by means of a plurality of probes going out from a probe head does not allow the transmission of an electromagnetic signal necessary for the testing of an embedded antenna. In fact, as it can be noted in FIG. 4, the pads 8 are usually positioned at the outline of the integrated circuit IC 10 to be tested, that comprises the antenna 12 and the transceiver/transponder (TxRx) 13. In this way, the probes (substantially metallic needles) contacting the pads actually create a Faraday cage that ideally isolates the portion comprising the antenna 12 and the transceiver/transponder 13, exactly.

In fact, current methodologies of testing on wafer do not allow a testing of embedded antennas, that can be tested only after the wafer dicing and the chips encapsulation in the corresponding packages, with an increase of the costs for the possible faulty chips found in this step.

An embodiment provides a method for testing embedded antennas on integrated circuits already in the on wafer testing step, overcoming the limits and the drawbacks still affecting the methods realized according to the prior art.

In an embodiment, an electromagnetic structure is realized on the integrated circuit comprising an embedded antenna, the electromagnetic structure includes an electromagnetic loopback by means of the creation of at least one test antenna associated with the embedded antenna, as well as means for the transmission and reception of electromagnetic signals for the testing of the operation of the embedded antenna.

In an embodiment, a test circuit of an integrated circuit on wafer of the type comprising at least one antenna of the embedded type, comprises at least one test antenna associated with said at least one embedded antenna that realizes a wireless loopback connection creating a wireless channel for said at least one embedded antenna and allows its electric test, transforming a communication electromagnetic signal between said at least one embedded antenna and said at least one test antenna into an electric signal that can be read by a test apparatus.

Embodiments may comprise the following supplementary and optional features, which may be taken singularly or, if desired, in combination.

In an embodiment, the test circuit, of an integrated circuit on wafer of the type comprising at least one first and one second embedded antenna, can comprise at least one first and one second test antenna respectively associated with said first and second embedded antennas in a wireless loopback connection.

In an embodiment, said first and second test antennas can exchange RF signals of the irradiated type, with said first and second embedded antennas, conducted RF signals being transmitted inside the test circuit between said test antennas.

In an embodiment, said first and second test antennas can be interconnected through at least one transmission line or circuit network.

In an embodiment, said transmission line or circuit network can comprise active and/or passive components and means for enabling/disabling the operation of said test circuit.

In an embodiment, said transmission line or circuit network can be realized at least in part in a scribe line of separation of a first and a second integrated circuit comprising said first and second embedded antennas.

In an embodiment, said test circuit can comprise at least one first and one second transmission line or circuit network connected to said first and second test antennas, said first and second transmission lines or circuit networks being connected to each other.

In an embodiment, said first embedded antenna, said first test antenna and said first transmission line or circuit network can belong to a same integrated circuit, and in particular to said first integrated circuit and said second embedded antenna, said second test antenna and said second transmission line or circuit network can belong to a same further integrated circuit, and in particular to said second integrated circuit.

In an embodiment, said embedded antennas can be chosen among: dipoles of the magnetic type, capacitive antennas, hertzian dipoles.

In an embodiment, said test circuit can comprise a conductive layer realized above a passivation layer of said wafer comprising said at least one integrated circuit, said conductive layer having the possibility to be defined so as to surround with a closed loop said first and second embedded antennas.

In an embodiment, said closed loop can enclose more integrated circuits equipped with embedded antennas.

In an embodiment, said conductive layer can cover at least one of a first and of a second integrated circuit comprising said first and second test antennas.

In an embodiment, said conductive layer can cover a first and a second integrated circuit comprising said first and second test antennas.

In an embodiment, said conductive layer can be realized in part inside and in part outside at least one of a first and a second integrated circuit comprising said first and second test antennas.

In an embodiment, said test circuit can comprise at least one additional pad connected to said at least one test antenna and suitable for being contacted by at least one probe connected to said test apparatus.

In an embodiment, said test circuit can comprise at least one first and one second additional pad added in a scribe line of separation of a first and of a second integrated circuit comprising said first and second test antennas.

In an embodiment, said test circuit can comprise at least one first and one second additional pad realized in the area of a first and of a second integrated circuit comprising said first and second test antennas.

In an embodiment, said test circuit can comprise structures of the Ground Signal Ground type for RF measures.

In an embodiment, said at least one embedded antenna can be realized alternatively above, below or in part above and in part below said passivation layer.

In an embodiment, said conductive layer can comprise a metallization layer or a conductive polymer or conductive ink deposited above said passivation layer.

In an embodiment, said conductive layer can be isolated at least in part from said passivation layer by means of an isolating material.

In an embodiment, said test circuit can be associated with an ATE antenna connected to said test apparatus able to communicate with said test antennas.

In an embodiment, said test circuit can comprise a supplementary antenna able to communicate with said test antennas and with said ATE antenna.

In an embodiment, said ATE antenna can be associated with transmitting means such as a core of magnetic material or materials with high dielectric constant.

In an embodiment, said test circuit can be realized outside a portion of wafer whereon a first and a second integrated circuit comprising said first and second embedded antennas are integrated.

In an embodiment, said test circuit can be housed in a probe card of said test apparatus.

In an embodiment, said probe card can comprise said test antennas, connected through a transmission line or circuit network that realizes its cabled connection and associated with respective transmitting means such as cores of magnetic material or materials with high dielectric constant for improving the characteristics of a wireless connection to said first and second embedded antennas.

In an embodiment, said probe card can comprise a single test antenna equipped with means for coupling with said first and second embedded antennas.

In an embodiment, said transmitting means comprise a core of magnetic material suitably shaped so as to have portions protruding from said probe card in correspondence with said first and second embedded antennas.

In an embodiment, said test circuit, for the testing of at least one first and one second embedded antenna with magnetic dipole, can comprise a completely planar structure realized by a single level of conductive material that surrounds with a closed loop said first and second embedded antennas.

In an embodiment, said test circuit, for the testing of at least one first and one second embedded antenna with hertzian dipole, each embedded antenna being connected to a respective transceiver/transponder, said test antennas being with hertzian dipole face a respective embedded antenna with hertzian dipole and connected to a respective transmission line or circuit network.

In an embodiment, said test circuit, for the testing of at least one first and one second embedded antenna of the capacitive type, comprises a strip of conductive material that overlaps at least in part onto said first and second embedded antennas of the capacitive type.

In an embodiment, said test circuit, for the testing of at least one first and one second embedded antenna of the capacitive type, said embedded antennas of the capacitive type are realized above a passivation layer of said wafer comprising said at least one integrated circuit, may comprise a strip of conductive material realized so as not to overlap thereto and to be near each other so as to exploit the edge capacitive effects, or fringing effects.

In an embodiment, said embedded antennas of the capacitive type can comprise interdigitated structures.

In an embodiment, said test circuit may comprise an ATE antenna with magnetic dipole obtained by suitably shaping said strip of conductive material.

In an embodiment, said test circuit may be sized so as to reduce impacts on the operation of a first and of a second integrated circuit comprising said first and second test antennas, singled without removal of said test circuit.

In an embodiment, an integrated circuit of the type comprising at least one embedded antenna is singled starting from a wafer portion being equipped with a test circuit as above indicated, without removal of said test circuit, said integrated circuit comprising a portion of said test circuit having characteristics being compatible with said at least one embedded antenna.

In an embodiment, said portion of said test circuit may comprise one test antenna and sections of connection with the same.

In an embodiment, said portion of said test circuit can further comprise a transmission line or circuit network, implemented so as to reduce the impact of said portion of said test circuit on the operation of said embedded antenna of said integrated circuit.

In an embodiment, said embedded antenna being a resonant magnetic dipole, said residual portion of said test circuit may be a resonant system having characteristics being compatible with said embedded antenna.

In an embodiment, said transmission line or circuit network may be a capacitor placed in parallel to said test antenna.

In an embodiment, said capacitor may have an interdigitated structure comprising a first and a second plate, equipped with a plurality of teeth being spaced so as to stick with each other and separated by a serpentine-shaped gap area.

In an embodiment, said residual portion of said test circuit comprises at least one pad, to be used in the successive processing steps of said singled integrated circuit.

In an embodiment, said embedded antenna being of the capacitive type and said test circuit comprising a strip of conductive material, a residual portion of said strip of conductive material is configured to act as an antenna creating a dipole similar to the hertzian dipole and is coupled to a corresponding transceiver/transponder realizing a capacitive hertzian dipole.

In an embodiment, said residual portion of said strip of conductive material comprises one among: an interdigitated structure, a pair of strips of conductive material capacitively coupled to said embedded antenna of the capacitive type, and a plurality of shaped strips of conductive material.

In an embodiment, said integrated circuit comprises a ground plane for creating a patch antenna with said residual portion of said strip of conductive material.

In an embodiment, said integrated circuit, of the type comprising at least one first and one second embedded antenna and a transmission line or circuit network that connects a first and a second test antennas comprises at least one metallic path that extends from said test circuit up to a scribe line of said integrated circuit that is opened further to the cut of the wafer and then to the singling of said integrated circuit for disabling the functionality of said test circuit.

In an embodiment, said first and second embedded antennas being of the magnetic type, said integrated circuit comprises at least one pad to be connected to a test apparatus.

In an embodiment, said first and second embedded antennas being of the resonant type, said integrated circuit comprises a capacitor placed in series with said first and second test antennas.

In an embodiment, the first and second embedded antennas being of the capacitive type, said integrated circuit comprises a strip of conductive material shared by said first and second embedded antennas.

In an embodiment, said integrated circuit comprises a plurality of embedded antennas of different type and said portion of said test circuit comprises one or more of the above indicated features.

In an embodiment, a system comprises a plurality of integrated circuits realized as above indicated and equipped with at least one pad connected to said portion of said test circuit, said integrated circuits having the possibility to be interconnected using a groups or sub-group of connection means chosen among:

at least one wire bond
at least one bump
at least one TSV
at least one conductive strip.

In an embodiment, a system comprises a plurality of integrated circuits realized as above indicated and each of them being provided with at least one embedded antenna and with at least part of a test circuit that creates a system wireless network, said integrated circuits having the possibility to be assembled in a stacked structure and said system may comprise a supplementary antenna shared by test antennas of said test circuit.

In an embodiment, said integrated circuits have the possibility to be assembled in a face to face structure, so as to suitably couple said embedded antennas to test antennas of said test circuit, as well as said common supplementary antenna.

In an embodiment, said system comprises further connection bridges of the wireless type.

In an embodiment, a testing device comprises: a first test antenna configured to form a wirelessly loopback connection with a first embedded antenna of a semiconductor wafer to facilitate testing of the first embedded antenna by transforming an electromagnetic signal between the first test antenna and the first embedded antenna into an electrical signal; and a second test antenna configured to form a wirelessly loopback connection with a second embedded antenna of the semiconductor wafer to facilitate testing of the second embedded antenna by transforming an electromagnetic signal between the second test antenna and the second embedded antenna. In an embodiment, said first and second test antennas are configured to exchange radio frequency (RF) signals of an irradiated type, with said first and second embedded antennas, and to transmit RF signals inside the testing device between said test antennas. In an embodiment, said first and second test antennas are interconnected through at least one transmission line or circuit network. In an embodiment, said transmission line or circuit network crosses a scribe line of separation between a first and a second integrated circuit comprising said first and second embedded antennas. In an embodiment, the testing device comprises a conductive layer above a passivation layer of said wafer comprising said at least one integrated circuit, said conductive layer configured to form a closed loop surrounding said first and second embedded antennas. In an embodiment, said conductive layer covers at least one of a first and of a second integrated circuit comprising said first and second test antennas. In an embodiment, said conductive layer is realized in part inside and in part outside at least one of a first and of a second integrated circuit comprising said first and second test antennas. In an embodiment, the testing device comprises at least one additional pad coupled to at least one of the test antennas and configured to be contacted by at least one probe of the testing device. In an embodiment, the testing device comprises at least one first and one second additional pad added in a scribe line of separation of a first and of a second integrated circuit comprising said first and second test antennas. In an embodiment, the testing device comprises at least one first and one second additional pad in an area of one of a first and of a second integrated circuit comprising said first and second test antennas. In an embodiment, the testing device comprises an ATE antenna configured to communicate with said test antennas. In an embodiment, the testing device comprises a supplementary antenna configured to communicate with said test antennas and with said ATE antenna. In an embodiment, said ATE antenna is coupled to a transmitter associated with at least one of a core of magnetic material and a material with a high dielectric constant. In an embodiment, the first and second test antenna are outside a wafer portion whereon a first and a second integrated circuit are integrated, said circuits comprising said first and second embedded antennas. In an embodiment, the first and second antennas are housed in a probe card of said testing device. In an embodiment, said probe card comprises said test antennas, which are coupled together through at least one of a transmission line and a circuit network and are associated with respective cores of magnetic material or a material with a high dielectric constant. In an embodiment, said probe card comprises a single test antenna configured to wirelessly couple with said first and second embedded antennas. In an embodiment, the first and second embedded antennas each comprise a magnetic dipole and the first and second test antennas have a planar structure in a single level of conductive material that surrounds with a closed loop said first and second embedded antennas. In an embodiment, the first and second embedded antennas each comprise a hertzian dipole, each embedded antenna being coupled to a respective receiver/transmitter, wherein said test antennas each have a hertzian dipole, facing a respective embedded antenna with hertzian dipole, and are coupled to at least one of a transmission line or circuit network. In an embodiment, the first and second embedded antennas are of a capacitive type and the first and second testing antennas comprise one strip of conductive material that overlaps at least in part onto said first and second embedded antennas of the capacitive type. In an embodiment, the strip of conductive material is configured to form an ATE antenna with a magnetic dipole. In an embodiment, the first and second embedded antennas are of a capacitive type and are above a passivation layer of said wafer, and the first and second testing antennas comprise a strip of conductive material positioned so as not to overlap on the first and second embedded antennas and to be near enough to exploit edge capacitive effects. In an embodiment, the strip of conductive material is configured to form an ATE antenna with a magnetic dipole.

In an embodiment, an integrated circuit comprises: at least one embedded antenna; at least a residual portion of a first testing device configured to form a wirelessly loopback connection with the first embedded antenna to transform an electromagnetic signal between the first testing device and the first embedded antenna into an electrical signal. In an embodiment, said at least a residual portion of said first testing device comprises at least one pad configured to be used in successive processing steps after said integrated circuit is singled from a wafer. In an embodiment, said embedded antenna is of a capacitive type and said at least a residual portion of said testing device comprises is at least a residual portion of a strip of conductive material coupled to a corresponding transceiver/transponder and configured to form a capacitive hertzian dipole. In an embodiment, said at least a residual portion comprises at least a residual portion of a strip of conductive material, the integrated circuit further comprising a ground plane configured to form a patch antenna with said at least a residual portion of said strip of conductive material. In an embodiment, the at least a residual portion comprises a first test antenna and a residual portion of a metallic path, the residual portion of the metallic path extending from the first test antenna up to a scribe line of said integrated circuit.

In an embodiment, a method comprises: testing a semiconductor wafer comprising at least a first integrated circuit having a first embedded antenna by, coupling probes of a probe card to contact pads of the semiconductor wafer; forming a wireless loopback connection between the first embedded antenna and a first test antenna; transmitting an electromagnetic signal between the first embedded antenna and the first test antenna; and transforming the electromagnetic signal into an electrical signal. In an embodiment, the method further comprises: embedding at least a portion of the first test antenna in the first integrated circuit prior to the testing. In an embodiment, the method further comprises: subsequently separating the wafer into a plurality of integrated circuits.

In an embodiment, a system comprises: a testing device having a plurality of probes configured to electrically couple to a plurality of contact pads of a semiconductor wafer; and at least one testing antenna configured to form a wireless loopback connection with at least one embedded antenna of the semiconductor wafer when the plurality of probes are coupled to the plurality of contact pads of the semiconductor wafer. In an embodiment, the at least one testing antenna comprises a plurality of testing antennas configured to form wireless loopback connections with respective embedded antennas of the semiconductor wafer when the plurality of probes are in contact with the plurality of contact pads of the semiconductor wafer. In an embodiment, the plurality of testing antennas are embedded in respective integrated circuits of the wafer. In an embodiment, the at least one testing antenna is integrated into a probe head of the testing device. In an embodiment, the at least one testing antenna is embedded in the semiconductor wafer. In an embodiment, the at least one testing antenna is at least partially embedded in the semiconductor wafer.

In an embodiment, a system comprises: a testing device having a faraday cage and configured to communicatively couple to at least one integrated circuit of a semiconductor wafer; and at least one testing antenna configured to form a wireless loopback connection with at least one embedded antenna of the wafer when the testing device is communicatively coupled to the at least one integrated circuit of the semiconductor wafer. In an embodiment, the at least one testing antenna comprises a plurality of testing antennas configured to form wireless loopback connections with respective embedded antennas of the semiconductor wafer when the testing device is communicatively coupled to the at least one integrated circuit of the semiconductor wafer. In an embodiment, the plurality of testing antennas are embedded in respective integrated circuits of the wafer. In an embodiment, the at least one testing antenna is integrated into a probe head of the testing device. In an embodiment, the at least one testing antenna is embedded in the semiconductor wafer. In an embodiment, the at least one testing antenna is at least partially embedded in the semiconductor wafer. In an embodiment, the faraday cage comprises a plurality of probes configured to couple to a plurality of contact pads of the semiconductor wafer to electrically couple the testing device to the at least one integrated circuit of the semiconductor wafer.

The features and the advantages of embodiments of test circuits according to the disclosure will be apparent from the following description of example embodiments thereof given by way of indicative and non limiting example with reference to the annexed drawings.

BRIEF DESCRIPTION OF THE SEVERAL VIEWS OF THE DRAWINGS

In these drawings:

FIGS. 3A and 3B schematically show a RFID circuit realized according to the prior art;

FIG. 5A schematically shows a portion of a semiconductor wafer comprising at least one first and one second integrated circuit comprising respective antennas of the embedded type and being realized according to the prior art;

FIG. 5B schematically shows a portion of a semiconductor wafer comprising at least one first and one second integrated circuit comprising respective antennas of the embedded type and being realized according to an embodiment;

FIGS. 10, 11A, 11B, 12A, 12B and 12C schematically show a portion of a semiconductor wafer comprising at least one first and one second integrated circuit which comprise respective antennas of the embedded type and a test circuit according to different embodiments;

FIGS. 15, 16 and 17A-17D schematically show a portion of a semiconductor wafer comprising at least one first and one second integrated circuit which comprise respective antennas of the embedded type and a test circuit according to different embodiments;

FIGS. 18A-18B and 19A-19D schematically show an integrated circuit equipped with a test circuit according to different embodiments after singling.

DETAILED DESCRIPTION

Figure 1:
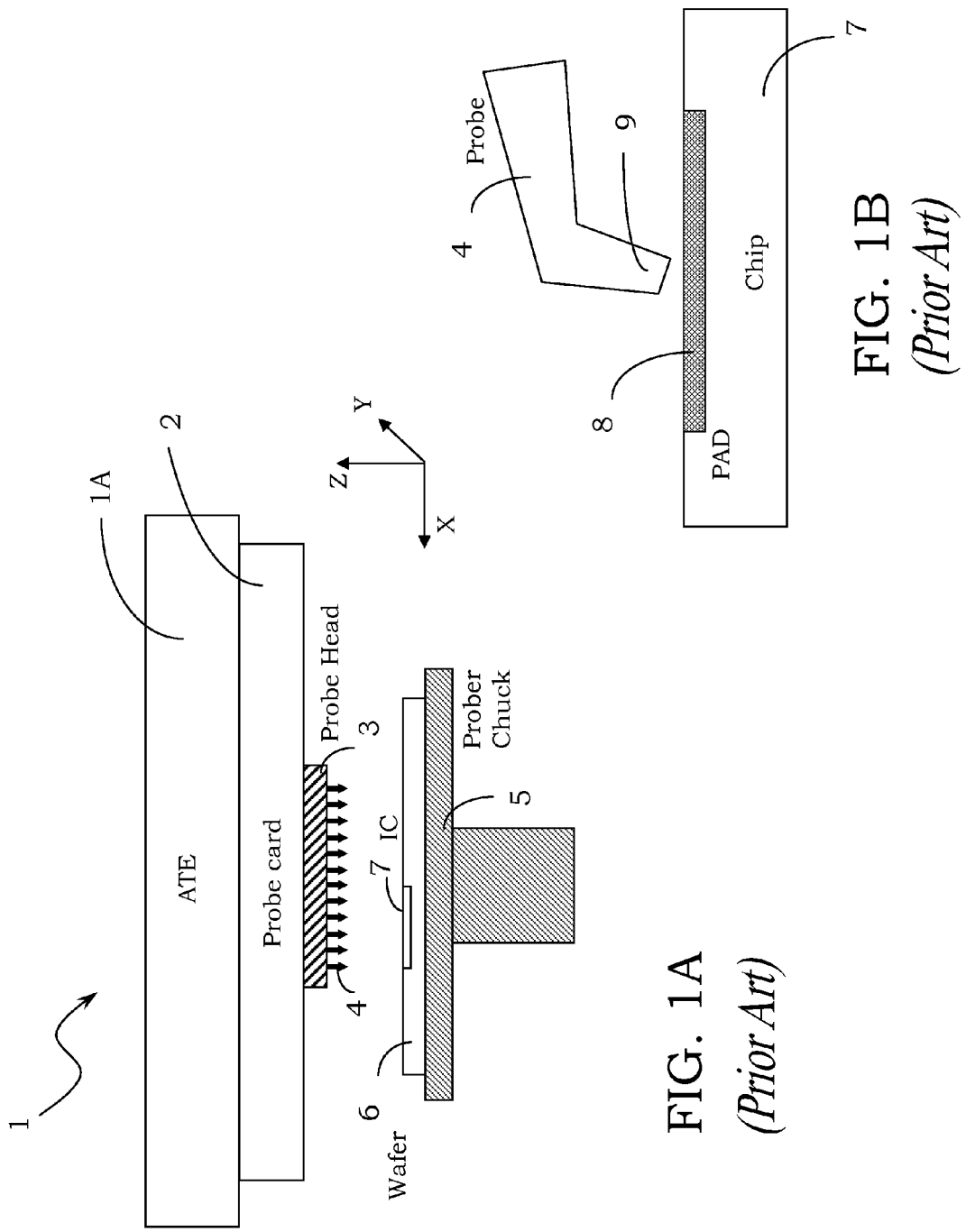
FIGS. 1A and 1B show, schematically and in greater detail, a test apparatus of circuits integrated on wafer being realized according to the prior art.
Figure 2:
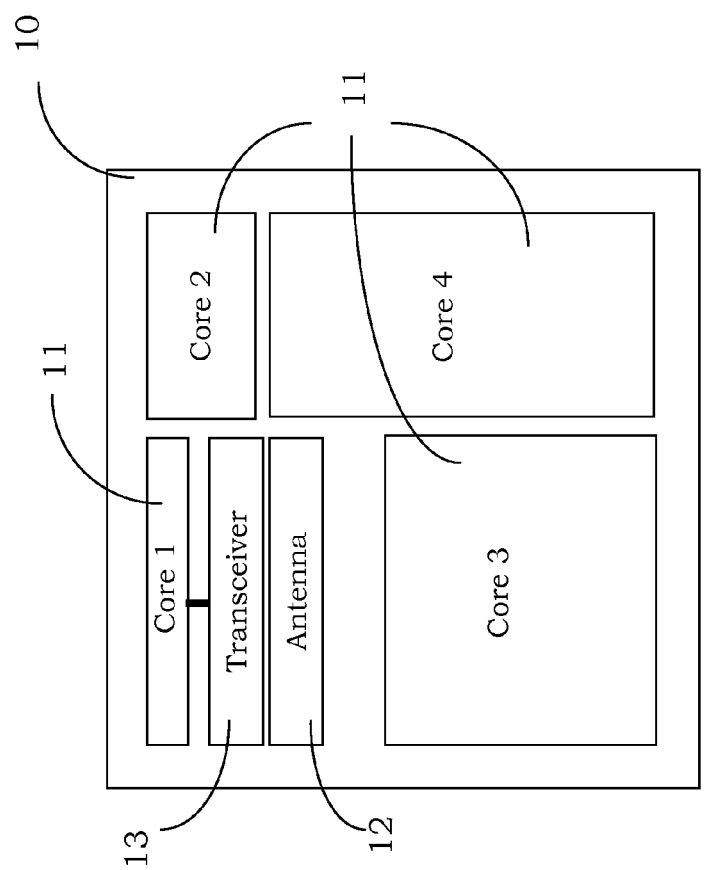
FIG. 2 schematically shows an integrated circuit comprising at least one antenna and being realized according to the prior art.
Figure 4:
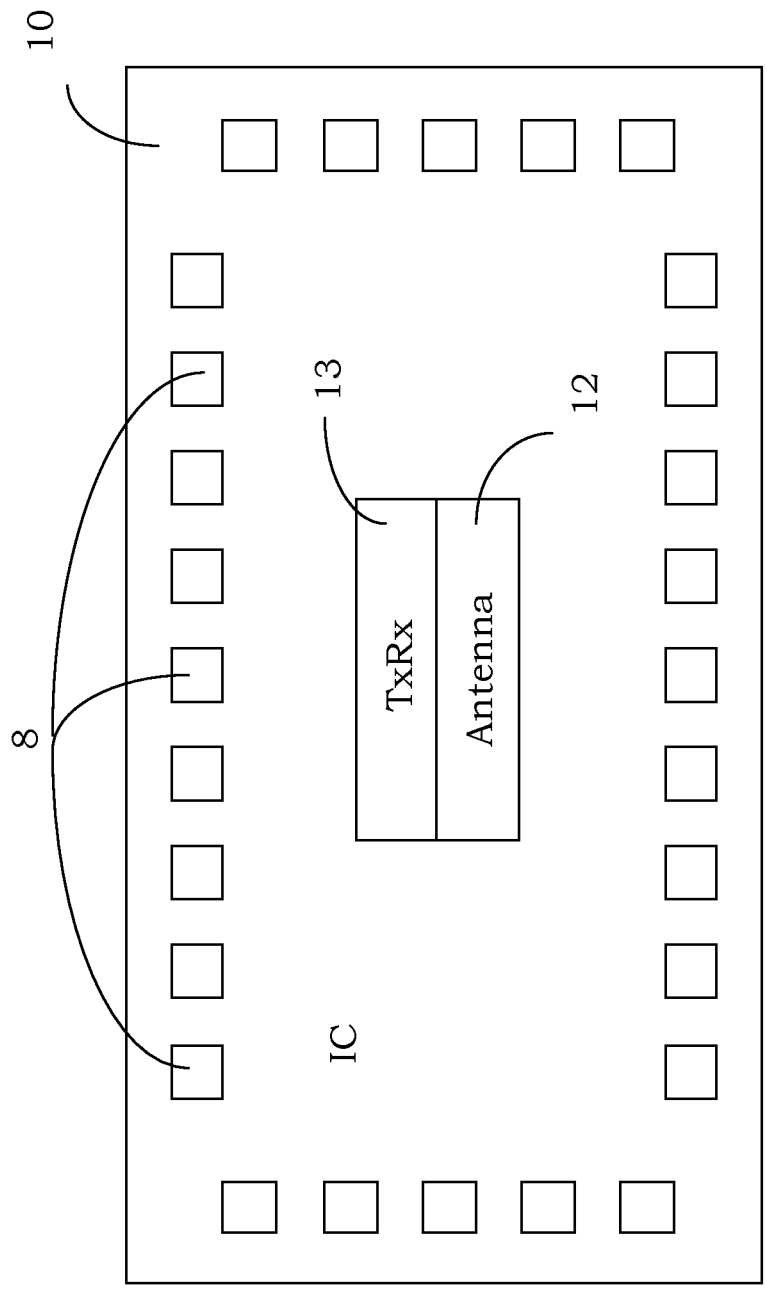
FIG. 4 schematically shows an integrated circuit comprising at least one antenna of the embedded type and a plurality of contact pads and being realized according to the prior art.

With reference to these figures, and in particular to FIGS. 5A and 5B, an integrated circuit is now described of the type comprising at least one antenna of the embedded type equipped with a test circuit able to execute testing, as it will be explained hereafter in the description.

It is to be noted that the figures are not drawn to scale, they are instead drawn so as to emphasize the features of embodiments. Moreover, in the figures, the different elements are represented in a schematic way, and their shape can vary according to the desired application.

In the following description, numerous specific details are given to provide a thorough understanding of embodiments. The embodiments can be practiced without one or more of the specific details, or with other methods, components, materials, etc. In other instances, well-known structures, materials, or operations, such as, for example, probes, probers, cores, RFID circuits, smart cards, fabrication processes, etc., are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" "according to an embodiment" or "in an embodiment" and similar phrases in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

FIG. 5A schematically shows a portion 20 of a semiconductor wafer comprising at least one first integrated circuit 21A and a second integrated circuit 21B, including respective antennas of the embedded type 22A and 22B, respectively, also indicated as Antenna 1A and Antenna 1B.

As illustrated, the first integrated circuit 21A, also indicated as IC A, comprises a first antenna of the embedded type 22A, also indicated as Antenna 1A, associated with a first transceiver/transponder circuit 23A, also indicated as TxRxA.

In its turn, the second integrated circuit 21B, also indicated as IC B, comprises a second antenna of the embedded type 22B, also indicated as Antenna 1B, associated with a second transceiver/transponder circuit 23B, also indicated as TxRxB.

The integrated circuits 21A and 21B are separated in a known way by isolating portions indicated as scribe line 25.

It is to be noted that each embedded antenna, Antenna 1A, respectively Antenna 1B, is connected to its respective transceiver/transponder circuit TxRxA, respectively TxRxB, that together with the antenna is part of the same integrated circuit IC A, respectively IC B.

FIG. 5B illustrates an embodiment for the testing of the embedded antennas in which a test circuit is used in a wireless loopback configuration, the test circuit being globally indicated with 24 and comprising further test antennas associated with the embedded antennas, for receiving and transmitting electromagnetic signals, verifying in this way the correct functionality of the embedded antennas.

As shown in FIG. 5B, a first test antenna 24A, also indicated as Antenna 2A, is associated with the first embedded antenna 22A and a second test antenna 24B, also indicated as Antenna 2B, is associated with the second embedded antenna 22B. More in particular, the first test antenna 24A and the first embedded antenna 22A are contained in the first integrated circuit 21A, while the second test antenna 24B and the second embedded antenna 22B are contained in the second integrated circuit 21B. By way of illustration, the respective transceiver/transponder circuits are not shown in FIG. 5B.

The first and second test antennas, 24A and 24B, are interconnected to each other crossing the scribe line 25, for creating a loopback connection of the wireless type that realizes the wireless loopback test circuit 24, so as to improve the wireless connection between the embedded antennas 22A and 22B, thus creating a channel of the wireless (or contactless) type between these embedded antennas, as it will be better described hereafter in the description.

A technique called DfT (acronym of "Design for Test") is used for the testing of the chips, in particular a loopback test. This test is based on the use of at least one loop constituted by a suitable physical connection between two circuits of the chip so as to execute its closed loop testing simultaneously offering the possibility to provide stimuli and measuring its responses. In particular, during the testing steps, an output signal is brought back to the input thanks to the loopback connection.

Such a physical or cabled loopback connection is difficult to realize in case of antennas that employ electromagnetic waves that are irradiated or received. In an embodiment, the test antennas are suitably connected to as to create a loop or loopback connection of the wireless type, as it will be clarified hereafter in the description. In particular, the use of the test antennas in loopback connection of the wireless type allows to overcome the problem of the screening of the embedded antennas by the probes that, placed on the integrated circuits in the testing step, screen at least in part the embedded antennas from each other.

Figure 6B:
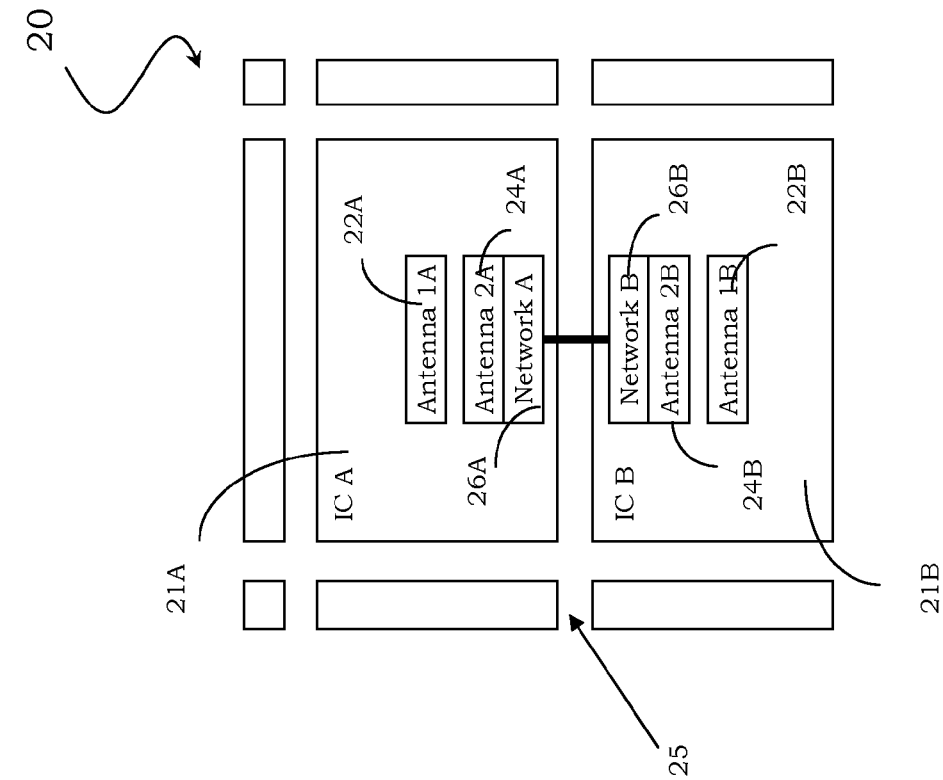
FIGS. 6A and 6B schematically show a portion of semiconductor wafer comprising at least one first and one second integrated circuit comprising respective antennas of the embedded type and a test circuit according to a first and a second alternative embodiment, respectively.
Figure 6A:
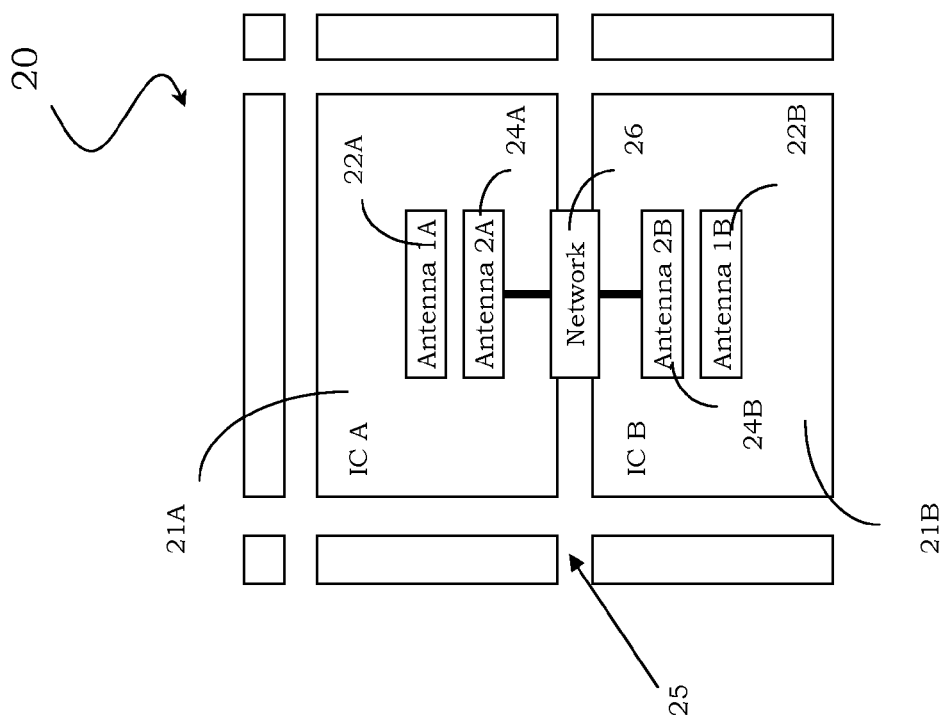

It is also possible to interconnect the test antennas to each other through a suitable transmission line or circuit network 26, also indicated as Network and which may be realized by means of active and/or passive components, as schematically shown in FIG. 6A. In a first embodiment, the transmission line or circuit network 26 is realized in the scribe line 25 of the wafer that contains the integrated circuits 21A and 21B, as illustrated in the scribe line 25 of horizontal separation (in the orientation direction of the figure) between these integrated circuits 21A and 21B.

This transmission line or circuit network 26 is used for improving the performances of the wireless loopback, and will have the possibility to be used also for acting thereon, for example for enabling/disabling its operation, using for example a fuse link or an electronic switch or other.

In another embodiment, each test antenna 24A and 24B is connected to respective first and second transmission lines or circuit networks, 26A and 26B, these circuit networks being connected to each other, as schematically shown in FIG. 6B. In this case, the first embedded antenna 22A, the first test antenna 24A and the first transmission line or circuit network 26A belong to a same integrated circuit and as illustrated to the first integrated circuit 21A, while the second embedded antenna 22B, the second test antenna 24B and the second transmission line or circuit network 26B belong to the second integrated circuit 21B. In this embodiment, the transmission line or circuit network 26, that comprises the first and second transmission lines or circuit networks 26A and 26B, is in part realized in the area of the first integrated circuit 21A (circuit network 26A or Network A) and in part in the area of the second integrated circuit 21B (circuit network 26B or Network B).

What has been described can be naturally extended to the case of more than two integrated circuits. In this case, the further integrated circuits, having respective embedded antennas, will be provided with respective test antennas suitably connected crossing the scribe lines that separate the integrated circuits in question, so as to create one or more wireless loopbacks.

Figure 7:
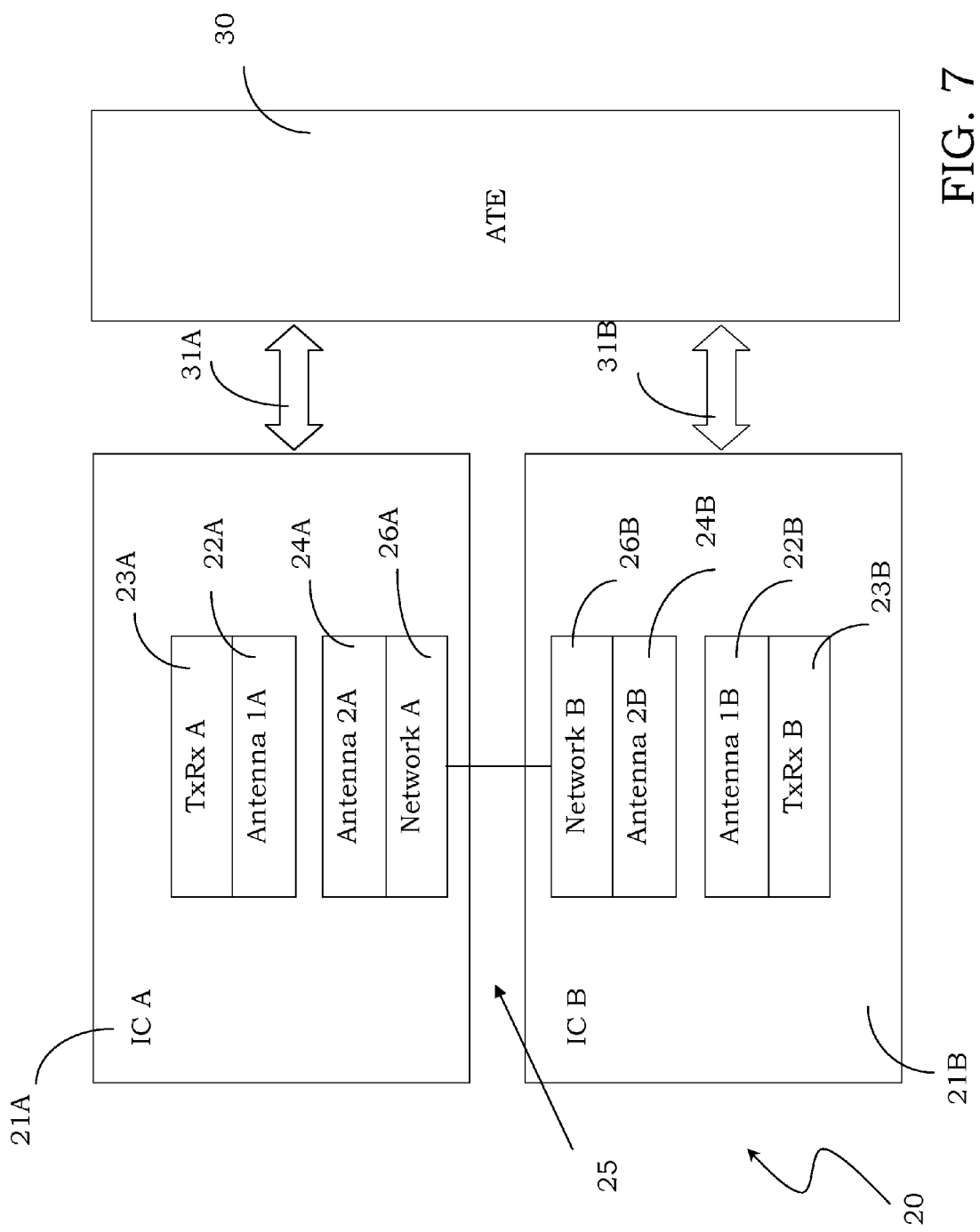
FIG. 7 schematically shows a portion of a semiconductor wafer comprising at least one first and one second integrated circuit comprising respective antennas of the embedded type and connected to a test apparatus.

During the testing steps, the first and second integrated circuit 21A and 21B are interconnected to a tester ATE 30, for example, in contact with the use of a traditional probe card, as schematically shown in FIG. 7.

For the testing of the embedded antennas, the first integrated circuit 21A transmits signals to the second integrated circuit 21B and receives signals from said second integrated circuit 21B through the wireless loopback realized by the first and second test antennas, 24A and 24B with the embedded antennas 22A and 22B. In this way, it is possible to verify the correct functionality of the embedded antennas 22A and 22B through the tester ATE 30 connected to the pads (not shown in the figure) of the first and second integrated circuits 21A and 21B through respective suitable connections or groups of connections 31A and 31B, in particular using a suitable testing methodology, for example a testing methodology known by the technical experts in the field.

Figure 8B:
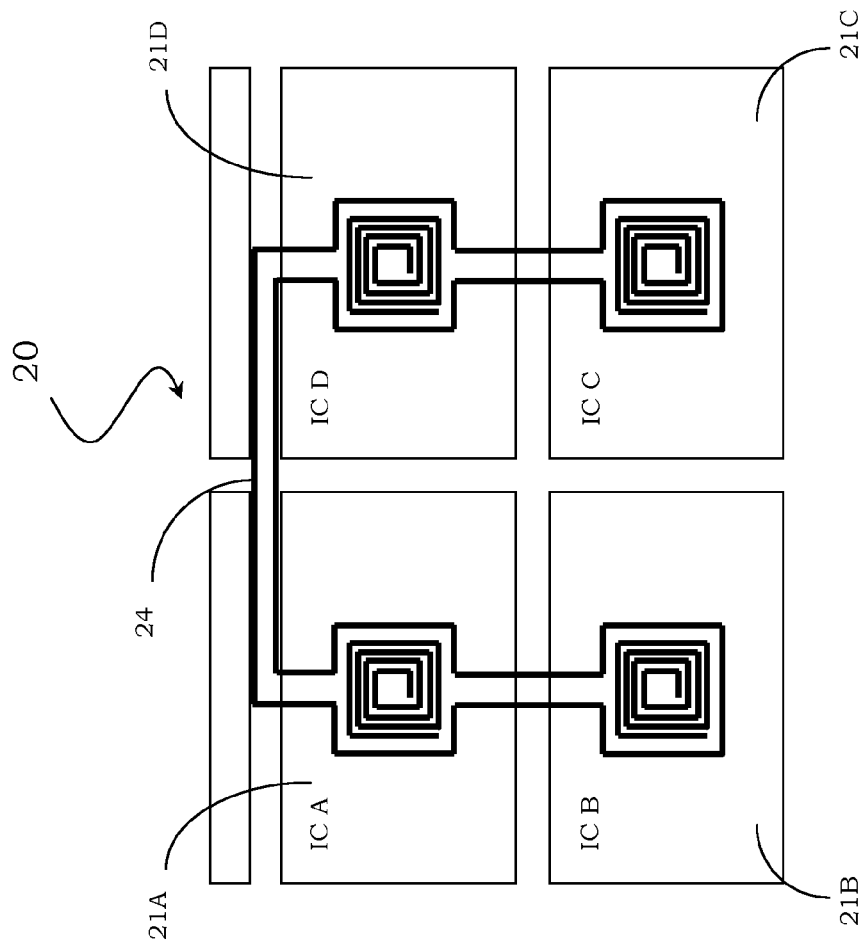
FIGS. 8A and 8B, 9A and 9B schematically show a portion of a semiconductor wafer comprising integrated circuits having antennas of the embedded type according to different embodiments.
Figure 8A:
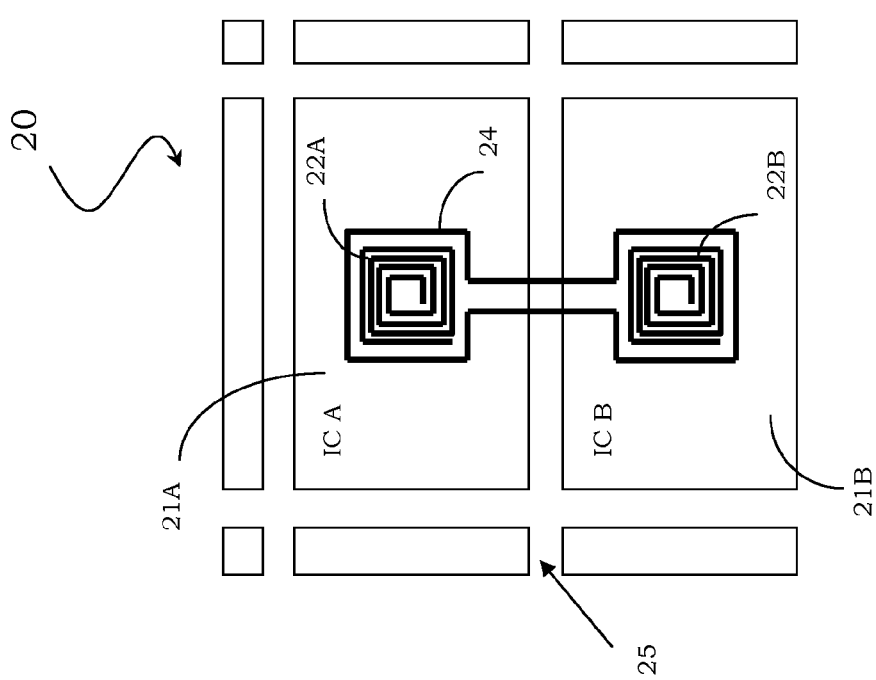

In an embodiment, the integrated circuits 21A and 21B comprise embedded antennas, 22A respectively 22B, that are dipoles of the magnetic type, as shown in FIGS. 8A and 8B.

As illustrated in FIGS. 8A and 8B, the wireless loopback test circuit 24 has a simplified, completely planar structure that uses a single metal level for surrounding with a closed loop, indicated with 24 in FIG. 8A, the first and second embedded antennas 22A and 22B.

It is possible to implement the wireless loopback test circuit 24 in a more complex way on the basis of the considered case and according to specific needs.

It is clear that in the implementation of the wireless loopback test circuit 24 of FIG. 8A the testing will indicate if one of the two embedded antennas 22A or 22B is faulty. In this embodiment, the testing will also indicate if both the embedded antennas 22A and 22B operate.

Advantageously, according to a further embodiment of the wireless loopback test circuit 24, as shown in FIG. 8B, it is possible to realize a loop path and create a cluster with more than two integrated circuits, in the example of the figure four integrated circuits 21A-21D. In this way, if one of these integrated circuits is faulty the testing is possible of the at least other two integrated circuits, identifying the faulty integrated circuit.

Figure 9B:
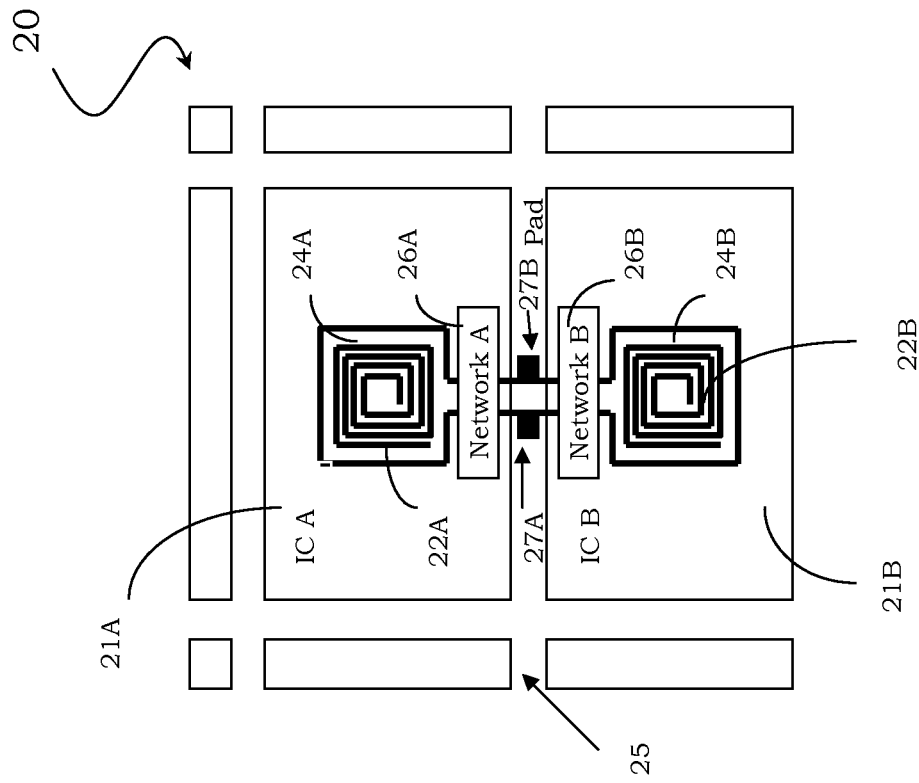
Figure 9A:
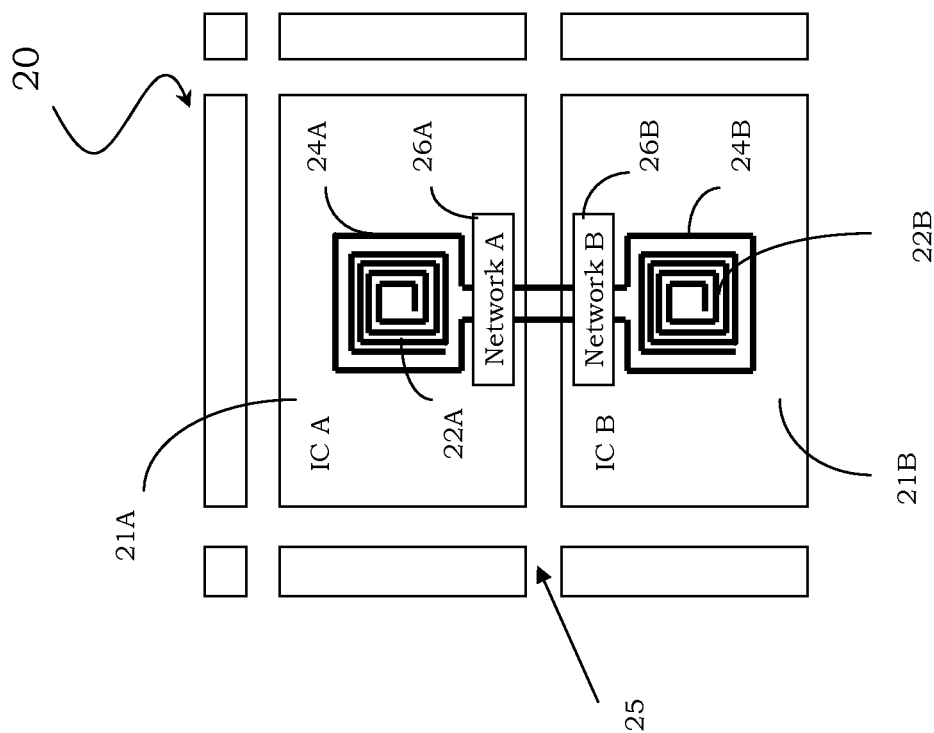

For improving the performances of the wireless loopback test circuit 24 suitable circuit networks can be added, as schematically shown in FIG. 9A, where a first integrated circuit 21A comprises a first test antenna 24A and a corresponding first transmission line or circuit network 26A while a second integrated circuit 21B comprises a second test antenna 24B and a corresponding second transmission line or circuit network 26B, interconnected in correspondence with the scribe line 25.

In an embodiment, at least one pad 27 is added to the wireless loopback test circuit 24. This pad 27 can be contacted by at least one probe of the test apparatus or ATE 30, for executing measures or possibly supplying stimuli.

In the embodiment of FIG. 9B, a first and a second additional pad 27A, 27B are added in the scribe line 25 in correspondence with the connections of the test antennas 24A and 24B, in the presence of corresponding transmission lines or circuit networks 26A, 26B, if any. Alternatively, the additional pads 27A, 27B or other test pads may realized in the area of one of the integrated circuits 21A, 21B.

In place of or in addition to the additional pads 27a and 27B it is also possible to create in the scribe line 25 or on the integrated circuits 21A, 21B suitable structures of the Ground Signal Ground type (GSG) for the RF measures.

In its most general form, the present disclosure thus relates to a test circuit of a circuit integrated on wafer of the type comprising at least one antenna of the embedded type.

Figure 10:
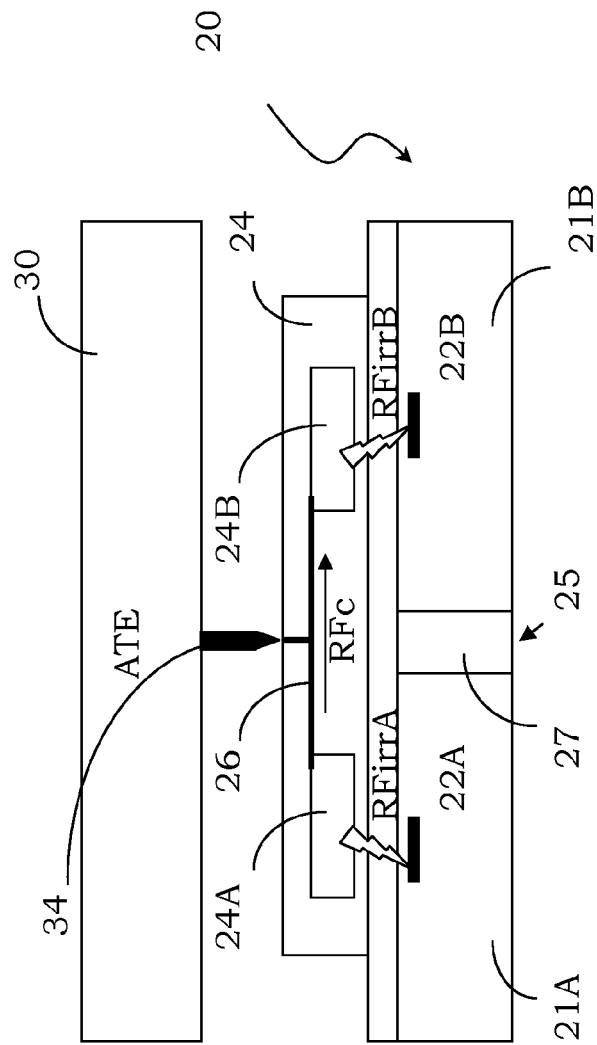

The test circuit 24 realizes a wireless loopback comprising at least one test antenna associated with the embedded antenna of the integrated circuit and allows its electric test. In particular, this test circuit 24 transforms an electromagnetic signal of communication between the embedded antenna and the test antenna into an electric signal inside the same, this electric signal having the possibility to be read by means of the probes of a test apparatus, as schematically shown in FIG. 10.

As illustrated, the test antennas 24A and 24B of the test circuit 24 exchange RF signals of the irradiated type, RFirrA and RFirrB, with the embedded antennas 22A and 22B of the integrated circuits 21A and 21B, while inside the transmission occurs of a RF signal indicated with RFc, along the transmission line or circuit network 26 that connects the test antennas 24A and 24B. The conducted RF signal, RFc, can be measured by means of at least one probe 34 connected to a test apparatus or tester ATE, globally indicated with 30, with an electric test of the traditional type. In this way it is possible to execute the test of an embedded antenna of a circuit integrated on wafer.

A RF signal of the irradiated type is a RF signal, or more in general an electromagnetic signal, that can be transmitted at close or long distance according to the particular case considered.

In a first embodiment, the wireless loopback test circuit 24 is realized above a passivation layer 28 that covers at least one integrated circuit 21A or 21B of the wafer, or on both the integrated circuits 21A and 21B. Alternatively, the wireless loopback test circuit 24 can be placed in part inside and in part outside at least one integrated circuit 21A or 21B. Furthermore, the embedded antennas 22A and 22B can be above or below or in part above and in part below the passivation layer 28.

Figure 11A:
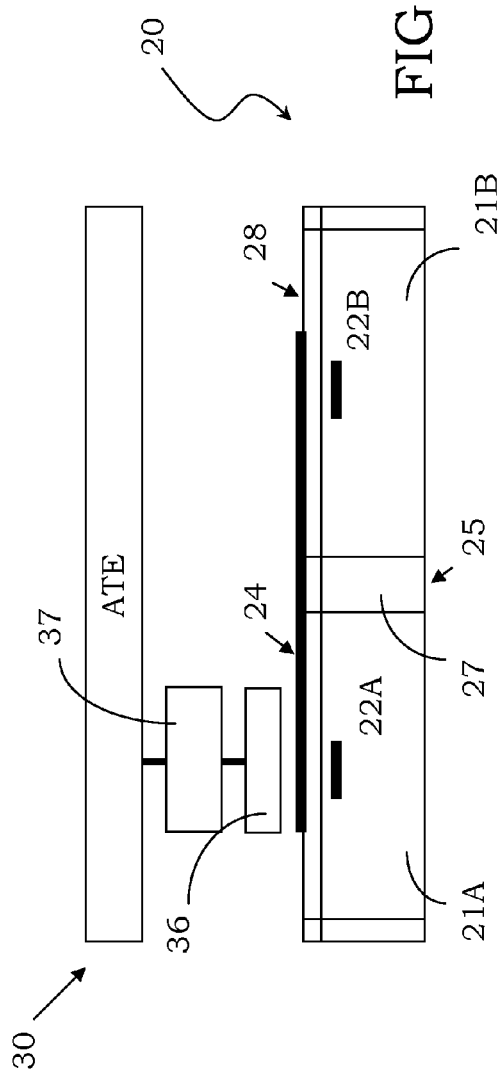
Figure 11B:
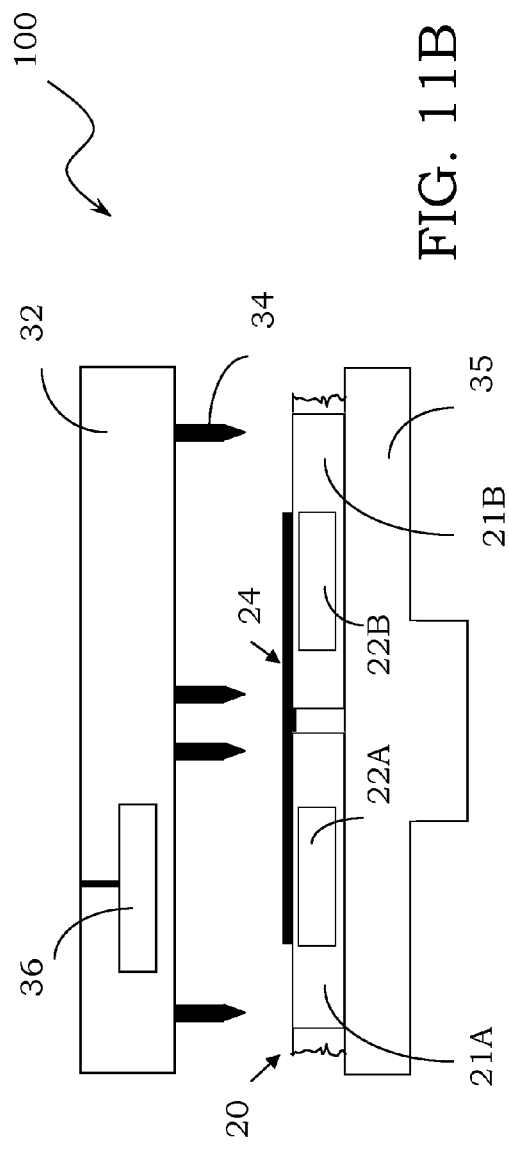

In an embodiment, as shown for example in FIGS. 11A and 11B, the wireless loopback test circuit 24 is realized above the passivation layer 28 that covers both the integrated circuits 21A and 21B. In an embodiment this wireless loopback test circuit 24 is realized with a layer of conductive material, for example a metallization layer or by a conductive polymer or by a conductive ink positioned, deposited or formed above the passivation layer 28 and suitably defined, for example through a photolithographic process.

Furthermore, the wireless loopback test circuit 24, placed above the passivation layer 28, can be possibly isolated at least in part therefrom by using an isolating material, such as for example an oxide, not shown since conventional.

It is to be noted that the wireless loopback test circuit 24 can be realized so as to cross or not a so called seal ring that surrounds at least one integrated circuit 21A or 21B. For example, in case of crossing by the wireless loopback test circuit 24, the seal ring is interrupted at least in part in a corresponding section.

As shown in FIG. 11A, the portion 20 of a wafer is tested thanks to the test apparatus or tester ATE 30, that comprises or is connected to at least one interface 37 of the wireless type with at least one ATE antenna 36 able to communicate with the test antennas 24A and 24B of the wireless loopback test circuit 24 realized above the passivation layer 28 associated with the embedded antennas 22A and 22B of the integrated circuits 21A and 21B on the wafer portion 20.

In an embodiment, the wireless loopback test circuit 24 comprises a supplementary antenna able to communicate with the test antennas 24A and 24B and thus the embedded antennas 22A and 22B of the integrated circuits 21A and 21B. Such a supplementary antenna can be present at least in part in the area of the first integrated circuit 21A and/or at least in part in the area of the second integrated circuit 21B and/or at least in part in the scribe line 25 and can also be of different type with respect to the embedded antennas 22A and 22B. In this case, the ATE antenna 36 may communicate with the supplementary antenna, that in turn may communicate with the test antennas 24A and 24B.

In an embodiment, schematically shown in FIG. 11B, the ATE antenna 36 is realized inside a probe card 32 of the test system 100. In particular, the wafer portion 20 is positioned on a support or prober chuck 35 of the test system 100, the probe card 32 being provided with probes 34 for the electric test of the integrated circuits 21A and 21B equipped with the wireless loopback test circuit 24.

The ATE antenna 36 can be realized on the lower surface of the probe card 32, so that this lower surface faces the wafer portion 20, so as to improve the characteristics of the wireless connection with the wireless loopback test circuit 24.

In an embodiment, as schematically shown in FIG. 12A, the ATE antenna 36 of the probe card 32 is associated with the transmitting means 38 with suitable characteristics, according to the type of ATE antenna 36 as considered for improving the wireless communication, like for example a core of magnetic material (i.e., materials with high magnetic permeability) or materials with high dielectric constant being able to allow for example to measure also the power being irradiated by the embedded antennas 22A and 22B, that will be with magnetic dipole, or respectively of the capacitive type.

In an embodiment, the wireless loopback test circuit 24 is implemented partially or completely outside with respect to the wafer portion 20 comprising the integrated circuits 21A and 21B. For example, it is housed in the probe card 32 of the tester ATE 30, as schematically shown in FIG. 12B.

In FIG. 12B, the test antennas 24A and 24B are realized in the probe card 32, the antennas being suitably connected for example through a transmission line or circuit network 26 that realizes its cabled connection. Moreover, the test antennas 24A and 24B are possibly associated with respective transmitting means 38A and 38B respectively, such as for example cores of magnetic material, for improving the characteristics of the wireless connection to the embedded antennas 22A and 22B of the integrated circuits 21A and 21B.

It is also possible to use a single test antenna, indicated with 39, equivalent to the ATE antenna 36 since it is also comprised in the probe card 32, suitably equipped with transmitting means for better communicating with the embedded antennas 22A and 22B. These transmitting means 38 can be for example constituted by a core or core of magnetic material suitably shaped so as to have portions outgoing from the probe card 32 in correspondence substantially exactly with the embedded antennas 22A and 22B and suitable for realizing a wireless connection with them, as schematically shown in FIG. 12C.

It is to be noted that, when the wireless loopback test circuit 24 is realized as previously seen above the passivation layer 28, after the testing steps that allow the test also of the embedded antennas 22A and 22B, it is simply possible to remove it, for example by means of a suitable chemical etching or through laser ablation or other.

However, it is possible to go ahead also with the singling of the integrated circuits on the wafer without removing this wireless loopback test circuit 24 too. In this case, a portion 24P of the wireless loopback test circuit 24 stays on each integrated circuit 21A and 21B after the action of cutting of the wafer executed with known modes, for example through a saw or a laser ray.

Figure 13A:
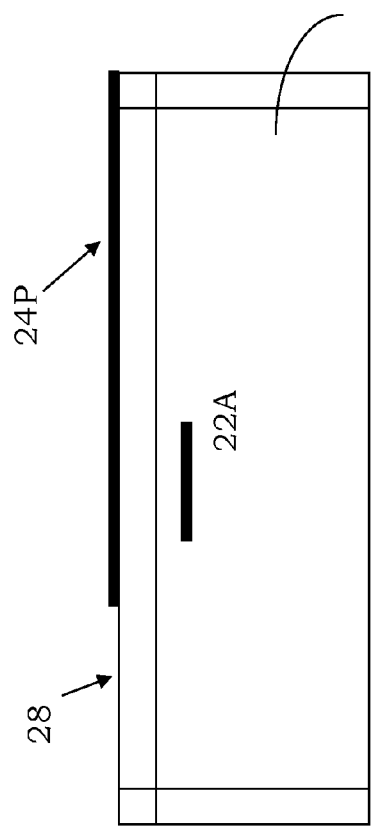
FIGS. 13A-13C, 14A and 14B schematically show an integrated circuit equipped with a test circuit according to different embodiments after singling.

In an embodiment, integrated circuits are obtained which are equipped with an additional structure, substantially corresponding to the test antennas of the wireless loopback test circuit 24, as shown for example in FIG. 13A with reference to the integrated circuit 21A, after singling without removal of the wireless loopback test circuit 24 being realized on the passivation layer 28. The integrated circuit 21A thus comprises a portion 24P of the wireless loopback test circuit 24, in the example of the figure being realized above the passivation layer 28.

Figure 13C:
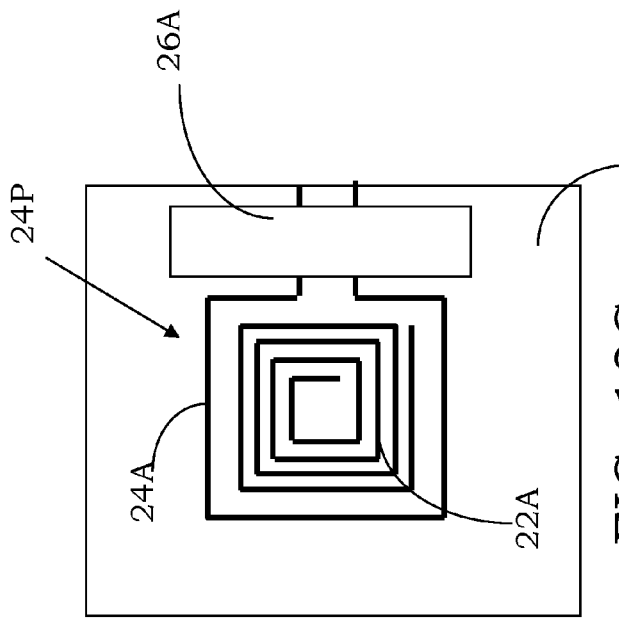
Figure 13B:
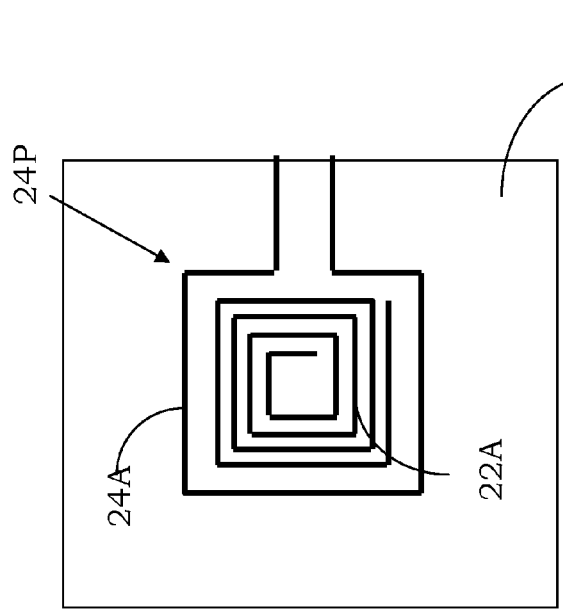

In an embodiment, as shown in FIG. 13B, the portion 24P comprises the test antenna 24A of the integrated circuit 21A and sections of connection to the test antenna 24B remained on the other integrated circuit 21B. Moreover, the portion 24P can comprise the transmission line or circuit network 26A, as shown in FIG. 13C.

In an embodiment, the transmission line or circuit network 26A is implemented so as to reduce the impact on the operation of the embedded antenna 22A given by the presence of the portion 24P of the wireless loopback test circuit 24 remained on the integrated circuit 21A after the action of cutting of the wafer.

In an embodiment, the embedded antenna 22A of the integrated circuit 21A is a resonant magnetic dipole, and the portion 24P of the wireless loopback test circuit 24 remaining on the integrated circuit 21A comprises the transmission line or circuit network 26A or a portion thereof, is configured as a resonant system with characteristics being compatible with the embedded antenna 22A, for example having the same resonance frequency.

Figure 14B:
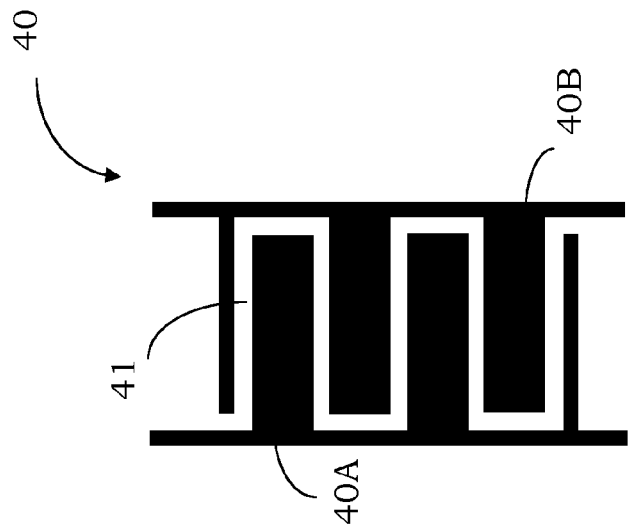
Figure 14A:
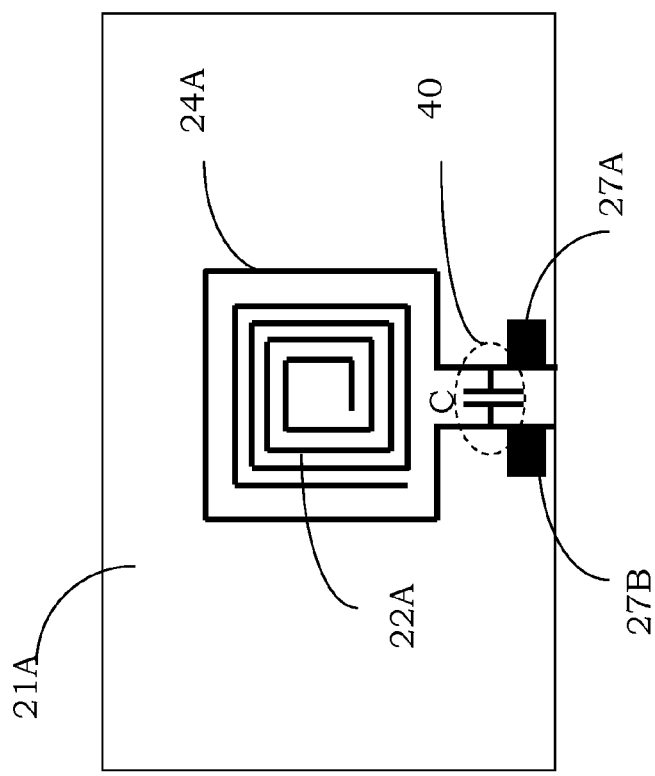

In an embodiment, the transmission line or circuit network 26A is configured as a capacitor C placed in parallel with the test antenna 24A, as schematically shown in FIG. 14A to realize the portion 24P of the wireless loopback test circuit 24 as a resonant system. In an embodiment, the capacitor C has an interdigitated structure 40 of the type shown for example in FIG. 14B. As shown, the interdigitated structure 40 of the capacitor C comprises a first and a second plate, 40A and 40B respectively, equipped with a plurality of teeth spaced so as to get stuck with each other and separated by a gap area 41 being serpentine-like shaped.

It is also possible to realize the wireless loopback test circuit 24 so that the portion 24P that remains after the singling of the integrated circuits 21A and 21B comprises at least one pad, for example two pads 27A and 27B, to be used in the successive steps of processing of the singled integrated circuit 21A, for example during the assembling or Final Test step.

To prevent undesired damages of the portion 24P of the wireless loopback test circuit 24 further to the cut, operated for example by means of a saw, suitable variations (not shown) can be introduced or the structures of the wireless loopback test circuit 24 that cross the scribe line 25, for example part of the transmission line or circuit network 26, can be suitably shaped.

Figure 15:
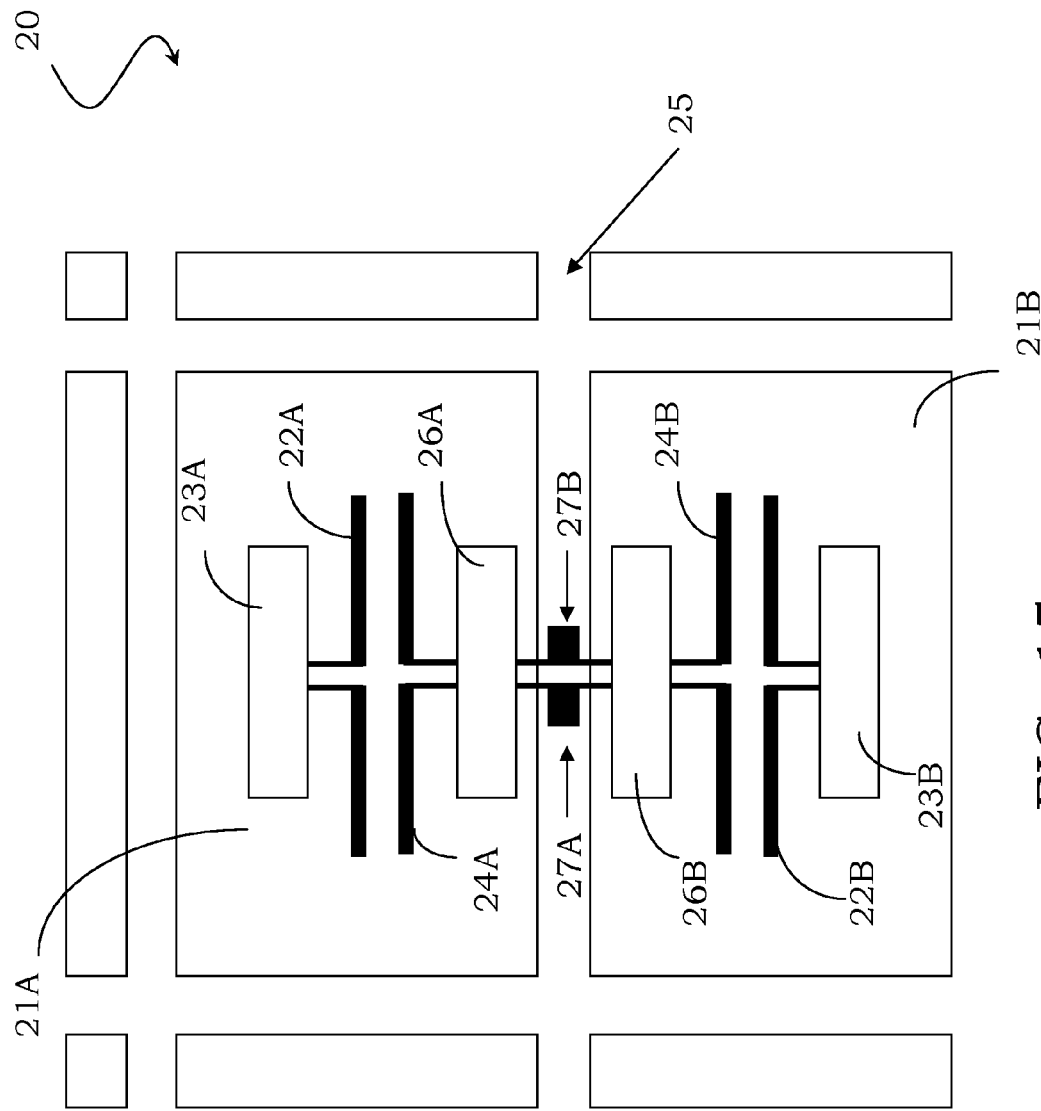

In an embodiment, a wireless loopback test circuit 24 can be used also in case of embedded antennas with hertzian dipole, as schematically shown in FIG. 15. In an embodiment, the test antennas may also be hertzian dipoles.

As shown in FIG. 15, each integrated circuit, 21A and 21B, comprises an embedded antenna with hertzian dipole, 22A and 22B, connected to a transceiver/transponder, 23A and 23B, as well as a test antenna with hertzian dipole, 24A and 24B, facing the respective embedded antenna with hertzian dipole, 22A and 22B respectively, and connected to a respective transmission line or circuit network, 26A and 26B. Furthermore, the wireless loopback test circuit 24 can comprise a pair of pads, 27A and 27B for example in the scribe line 25.

Figure 16:
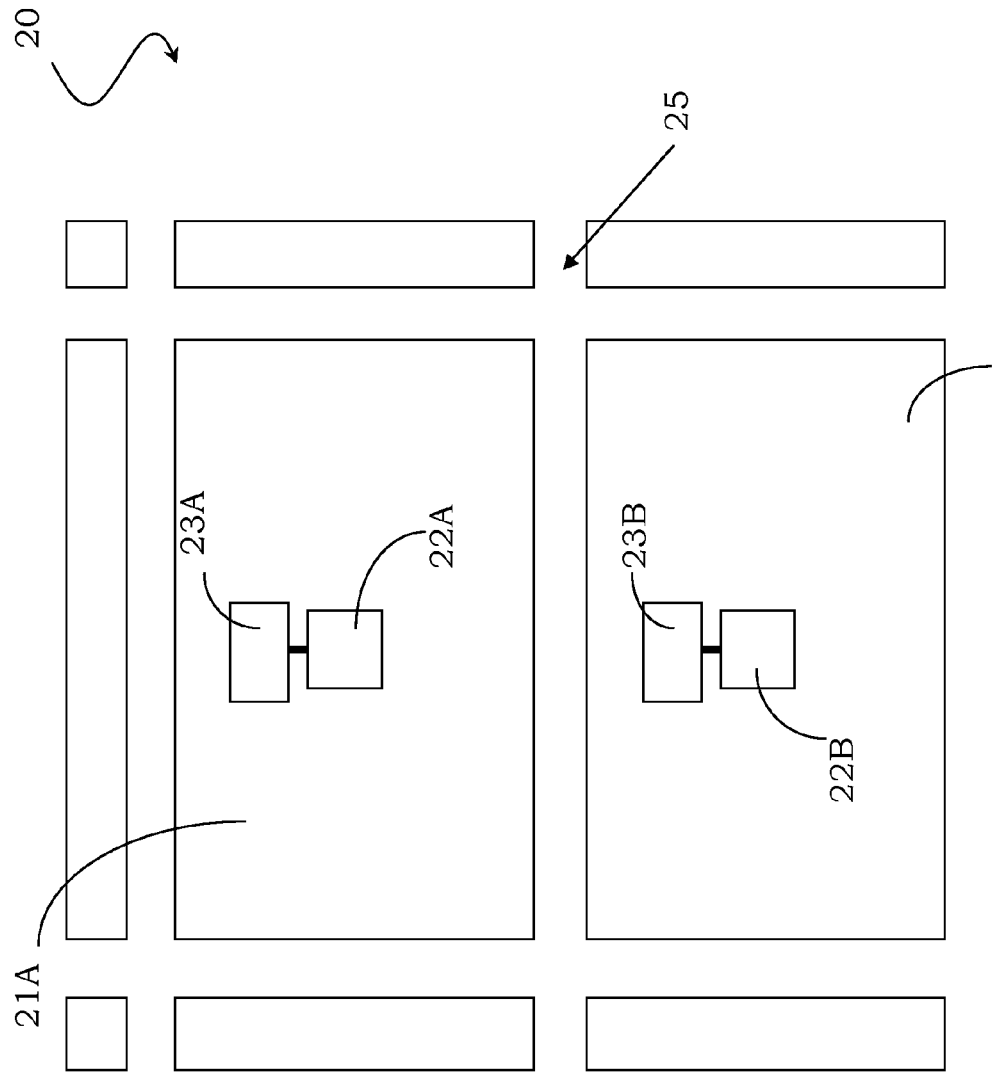

In an embodiment, a wireless loopback test circuit 24 can be realized also in case the embedded antennas are of the capacitive type, in particular realized by means of a metallic armature, as schematically shown in FIG. 16.

For example, as shown in FIG. 16, each integrated circuit, 21A and 21B, comprises an embedded antenna of the capacitive type, 22A and 22B, connected to a transceiver/transponder, 23A and 23B.

In an embodiment, the wireless loopback test circuit 24 is realized, for example, in a simple form, by means of a strip 24C of conductive material, for example metallic, that overlaps at least in part onto the embedded antennas of the capacitive type 22A and 22B, as schematically shown in FIG. 17A.

Due to the electric induction, in this way a flow of charges is obtained, and thus a current I, along the metal strip 24C, due to the variable electric field applied by at least one of these embedded antennas of the capacitive type, 22A and 22B.

Furthermore, it is possible to realize the metal strip 24C above the passivation layer 28, as shown in FIG. 17A, but also below this passivation layer 28.

Moreover, also the embedded antennas of the capacitive type, 22A and 22B, can be realized above the passivation layer 28, but also below this passivation layer 28.

In an embodiment shown in FIG. 17B by mere way of example, the embedded antennas of the capacitive type 22A and 22B are realized above the passivation layer 28 and the metal strip 24C is realized so as not to overlap thereon but in the portion of the passivation layer 28 between these embedded antennas of the capacitive type 22A and 22B. It is to be noted that the embedded antennas of the capacitive type 22A and 22B and the metal strip 24C may be positioned quite near with respect to each other so as to exploit the edge capacitive effects (or fringing effects).

It is also possible to realize embedded antennas of the capacitive type 22A and 22B with interdigitated structures 40 and dielectric materials for improving the capacitive coupling, as schematically shown in FIG. 17C. It is also possible to realize the metal strip 24C in the form of a wire and to realize at least one pad 27 thereon, this pad 27 having the possibility to be connected to the tester ATE 30 in a known way through a probe 34, so as to receive or transmit electric signals.

It is possible to replace the pad 27 with suitable structures of the Ground Signal Ground (GSG) type for the RF measures.

The pad 27 can be in turn an antenna.

In an embodiment, the wireless loopback test circuit 24 can comprise a supplementary antenna of the non capacitive type obtained by suitably shaping the metal strip 24C for creating for example a magnetic dipole or winding 24S, as shown in FIG. 17D, the embedded antennas 22A and 22B being yet of the capacitive type.

A dipole is realized similar to a magnetic dipole. This dipole 24S may be coupled to the transponders/receivers 23A and 23B through a capacitive interface, thus realizing a capacitive magnetic dipole or CMD (acronym of "Capacitive Magnetic Dipole").

It is to be noted that, in case of singling of the integrated circuits 21A and 21B on the wafer portion 20 being equipped with this wireless loopback test circuit 24, without removal of the same, the residual portion 24P of the wireless loopback test circuit 24, in particular of the metal strip 24C, may act as an antenna creating a dipole similar to the hertzian dipole, that, being coupled to the corresponding transceiver/transponder of a capacitive interface, realizes a capacitive hertzian dipole or CHD (acronym of "Capacitive Hertzian Dipole"), as schematically shown in FIGS. 18A and 18B in case of singling of the integrated circuit 21A without removal of the wireless loopback test circuit 24 and globally indicated with 24H.

Figure 19A:
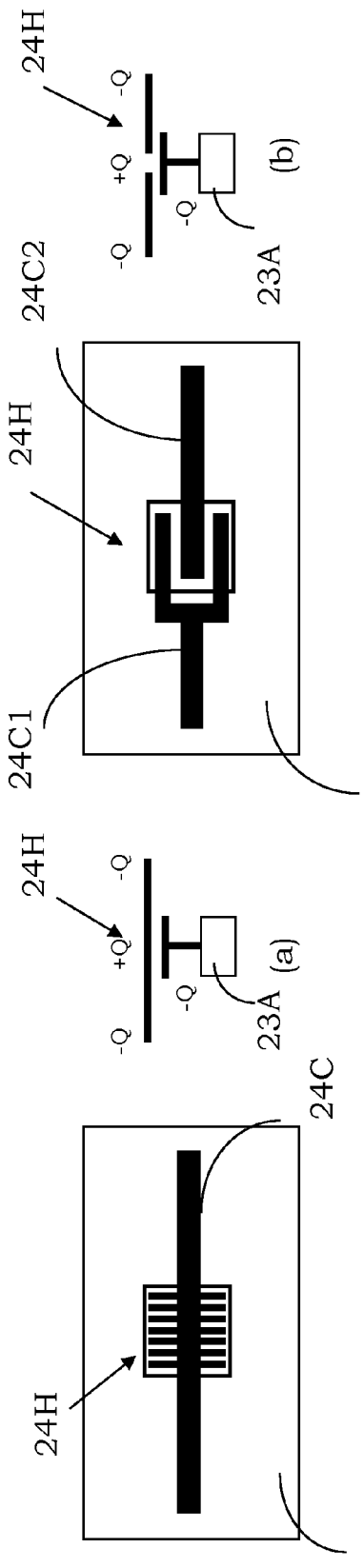

It is possible to introduce different modifications for improving this type of dipole CHD, for example using interdigitated structures of the type shown in FIG. 19A, obtaining a capacitive hertzian dipole 24H according to the scheme (a).

Figure 19B:
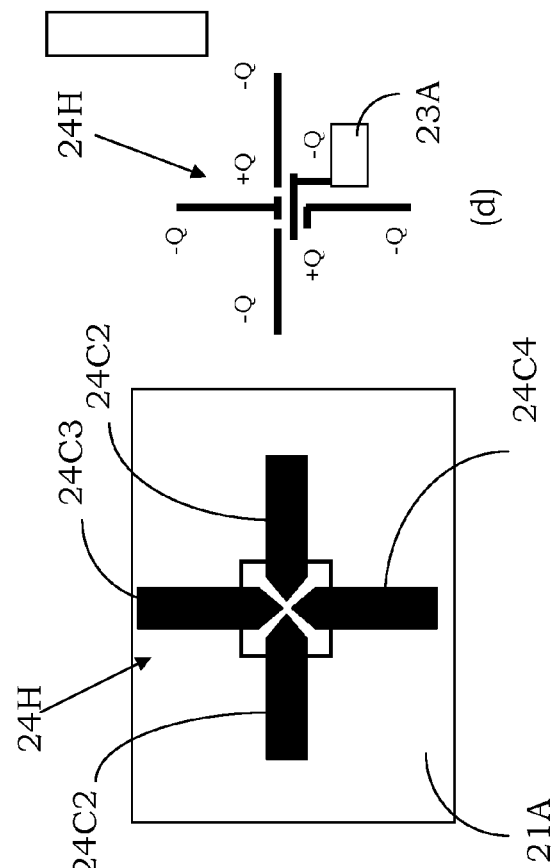
Figure 19C:
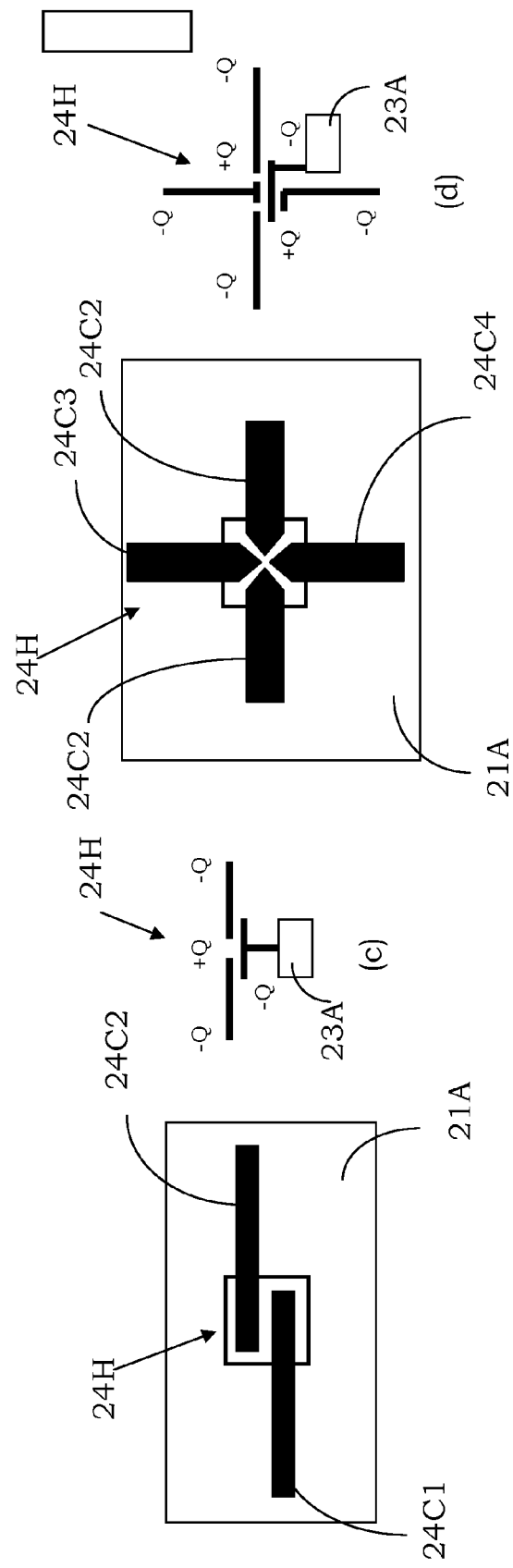

It is also possible to use two conductive strips for example metallic ones, 24C1 and 24C2, being suitably capacitively coupled to the antenna and obtain again one capacitive hertzian dipole 24H, as schematically shown in FIGS. 19B and 19C according to the schemes (b) and (c) that correspond to each other.

Figure 19D:
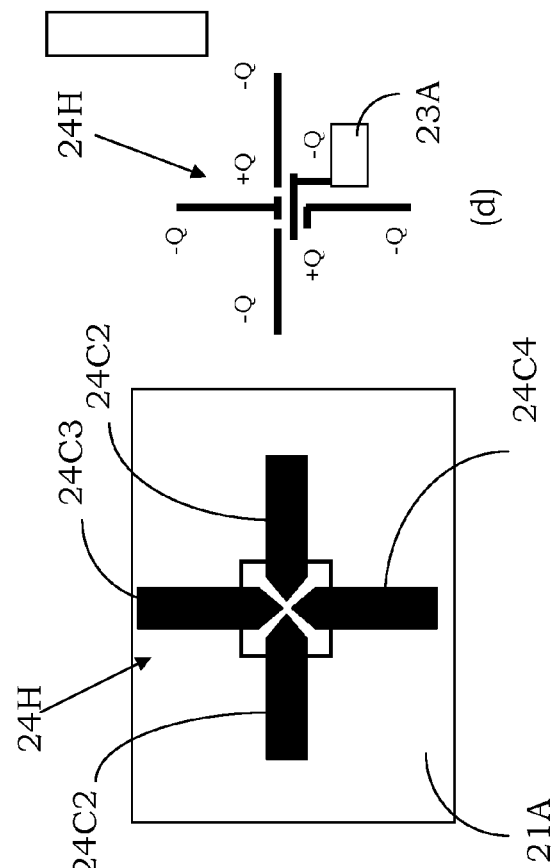

Furthermore, it is possible to increase the number of the conductive strips and to suitably shape them, as schematically shown in FIG. 19D in the case of four conductive strips, 24C1-24C4, obtaining a capacitive hertzian dipole 24H according to the scheme (d).

In this sense several techniques can be used for shaping and possibly setting at least one of the conductive strips, for example through laser.

Other embodiments within the reach of the technical experts in the field after review of the specification are possible, the schemes shown in the figures being given exclusively by way of non limiting example.

For example, by introducing a ground plane, it is possible to create a patch antenna instead of a capacitive hertzian dipole. Moreover, it is possible to consider that an embedded antenna, 22A for example, is connected to a transmitter while the other embedded antenna, 22B for example, is connected to a receiver.

Figure 20:
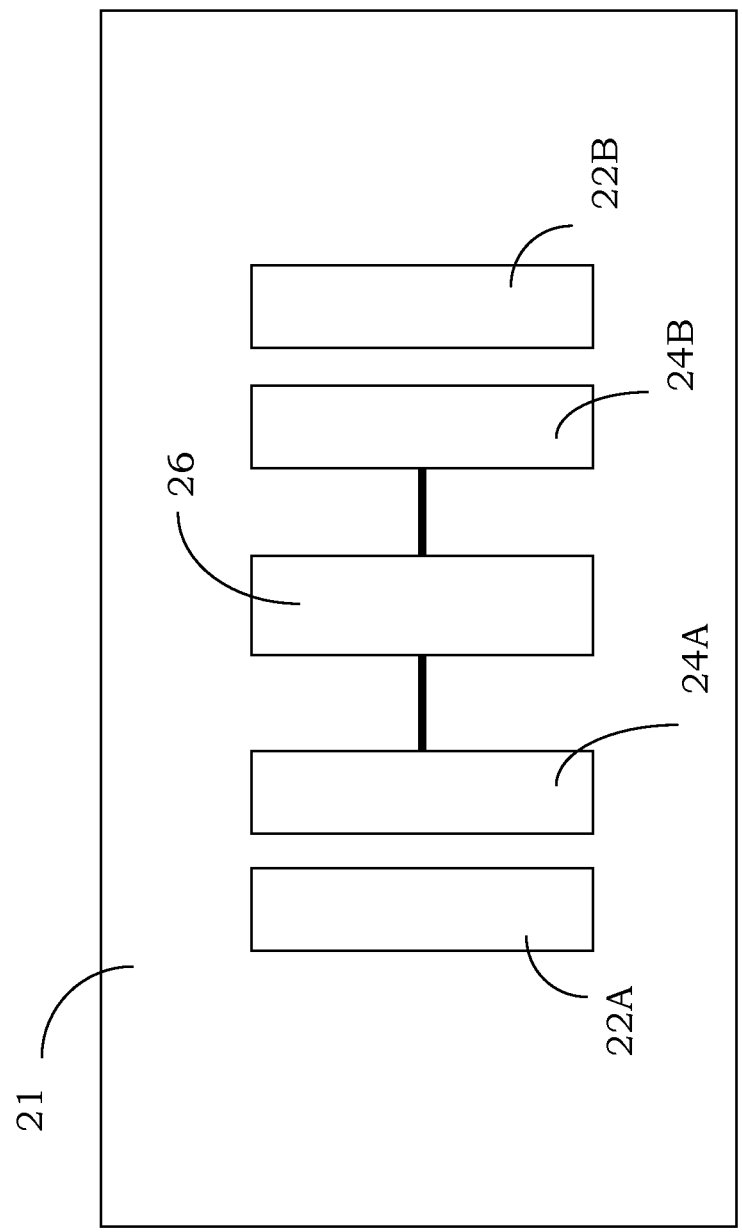
FIG. 20 schematically shows an integrated circuit comprising at least two antennas of the embedded type and a test circuit according to an embodiment.

In an embodiment, the wireless loopback test circuit 24 can be realized also completely inside a single integrated circuit 21 equipped with at least two embedded antennas 22A and 22B, as schematically shown in FIG. 20, providing at least one transmission line or circuit network 26 that connects the test antennas 24A and 24B and creating a wireless network integrated on the chip, hereafter indicated as Wireless Network on-Chip or WNoC.

The network WNoC can be used also in the final application, when the integrated circuit 21 is inside a package.

It is possible to provide at least one metallic path that from the wireless loopback test circuit 24 extends up to the scribe line of the integrated circuit. In this way, further to the cut of the wafer and then of the singling of the integrated circuit 21, this metallic path is opened for disabling the functionality of the wireless loopback test circuit 24.

It is possible, for example in the case of antennas of a magnetic type, to realize the wireless loopback test circuit 24 on the single integrated circuit 21, providing it with at least two pads to be connected to the tester ATE through probes, if any, as previously seen.

It is to be noted that in this case an inductive network of the wireless type is realized on the chip, hereafter indicated as Inductive Wireless Network on-Chip or IWNoC.

In an embodiment, instead of having a transmitter Tx and a receiver Rx there are two transceivers or two transponders connected to the embedded antennas of the magnetic type.

In an embodiment, the wireless loopback test circuit 24 can be a normally open circuit, that is closed and then enabled for the operation only during the testing steps thanks to at least two probes that contact the at least two pads in case of wireless loopback test circuit 24 of the inductive type, closing the circuit and allowing also the tester ATE to execute measures and/or to send and receive signals.

The pads can be near the perimeter of the integrated circuit like the other pads of electric testing.

In an embodiment, for example in case of embedded antennas of the resonant type, it is possible to use a circuit network for improving the performances of the wireless loopback test circuit 24, for example by using a capacitor C placed in series to the test antennas, possibly realized with interdigitated structures as previously explained.

In an embodiment, for example in case of a metallic path of the wireless loopback test circuit 24 that extends up to the scribe line, it is possible to disable the functionality of this circuit after the cut action of the wafer.

In a similar way, it is possible to consider an integrated circuit 21 equipped with at least two antennas of the capacitive type constituted by a metallic armature. By way of example, each antenna can belong to a suitable core (or circuit block or group of circuits) of the integrated circuit, that transmits and receives information also in a wireless way with other cores of the integrated circuit itself. It is noted that a core may comprise, for example, one or more memories, one or more processors, discrete circuitry, etc., and various combinations thereof.

In an embodiment, it is possible to use a wireless loopback test circuit 24 for the single integrated circuit 21, constituted for example by a conductive strip common to the various embedded antennas of the capacitive type, and to realize a wireless network of the capacitive type on the chip, also indicated as Capacitive Wireless Network on-Chip or CWNoC, that can be bidirectional or unidirectional.

Moreover various hybrid implementations are possible, in case of an integrated circuit 21 having for example two cores with two respective embedded antennas of the capacitive type (or a core with a differential capacitive interface connected to two embedded antennas of the capacitive type) and another core with an antenna of the inductive type, thus realizing a wireless network of the heterogeneous type on the chip, also indicated as Heterogeneous Wireless Network on Chip or HeWNoC, the capacitive and inductive networks, CWNoC and IWNoC being instead of the homogeneous type (Homogeneous Wireless Network on Chip or HoWNoC).

Everything that has been previously said for the case of a first and a second integrated circuit 21A and 21B can be extended to the case of a single integrated circuit 21 equipped with at least two embedded antennas 22A and 22B, as well as to the case of a cluster comprising at least two contiguous integrated circuits, where this cluster has been made by the cut of the same wafer and this contiguous integrated circuits are equipped with a wireless loopback test circuit 24 that can be used for creating a system wireless network, also indicated as Wireless Network on-System or WNoS, of the homogeneous or heterogeneous type, as above indicated.

Moreover, the networks WNoC and WNoS can be used also on the final application when the integrated circuit or the singled cluster is for example inside a package, and the integrated circuit or circuits present therein can be physically connected to the substrate of this package through bumps or wire bonds.

Furthermore, the presence of at least one pad connected to the wireless loopback test circuit 24, in case of singled integrated circuits singled without removal of the same, allows to create interconnections by using a group or a sub-group of connection means chosen among:

at least one wire bond
at least one bump
at least one TSV (acronym of "Through Silicon Vias")
at least one conductive strip for creating a WNoS between different integrated circuits equipped with the residual portion 24P of the wireless loopback test circuit 24 (re-creating a connection between these residual portions of the wireless loopback test circuit 24), creating in this way planar or stacked configurations or other.

In one stacked structure WNoS networks can be easily realized thanks for example to the presence of a supplementary antenna common to the test antennas, as above indicated.

For creating a WNoS between the different integrated circuits equipped with the residual portion 24P and/or with a WNoC a face to face assembly can be used, for example, so as to suitably couple the antennas to each other.

Moreover between two integrated circuits, respectively equipped with at least one residual portion 24P, or for a single integrated circuit, connection bridges of the wireless type (wireless bridges) can be used, if any, that can be realized through a circuit similar to the wireless loopback test circuit realized on a substrate, for example a PCB or a flexible material or ceramic.

After the assembly and packaging process, a final test or FT (acronym of "Final Test") is typically executed of a system so obtained, in a similar way to the testing EWS on wafer. In case of singling and packaging without removal of the wireless loopback test circuit 24, the residual portion 24P will have the possibility to be used also within the testing on package.

In general, the various antennas can be all identical to each other or all different or identical in groups, and antennas can be also used being different from the antennas of the inductive and capacitive type. Moreover, in case of more than one wireless loopback test circuit 24 realized on a same integrated circuit, they can be identical or different from each other.

Furthermore the supplementary antenna can be such as to transmit information at long distances for applications that require wireless communication with remote systems.

Furthermore, the at least one wireless channel realized thanks to the wireless loopback test circuit 24 can transmit information using one or more known transmission techniques, with possible suitable protocols and codifications.

Moreover, the information can be transmitted using for example the at least one frequency, which may be predetermined, so that the different parts of the system can communicate with each other at different frequencies and with different transmission techniques.

These frequencies can, for example, be fixed a priori or can be programmable in the various parts of the system.

Hybrid implementations are possible with respect to those shown, together also with the prior art.

The generic IC antenna can be integrated in a monolithic way in the integrated circuit and extend inside its body, or it can be advantageously created above the same, through an additional or post-processing process above the upper surface of the body of the integrated circuit.

A generic antenna can be created also on the back of the integrated circuit and can be connected to the circuits of the chip through at least one TSV. The wireless loopback test circuit 24 may also be created on the back of the integrated circuit.

Embodiments of test circuits facilitate creating contactless/wireless communication channels with high performances between at least two embedded antennas of at least one integrated circuit thanks to a connection of the wireless loopback type.

The presence of such a connection of the wireless loopback type allows the testing of the embedded antennas simplifying the testing system that does not mandatorily need to be equipped with wireless interfaces and thus reducing the cost of the testing itself.

In an embodiment, a wireless loopback test circuit 24 facilitates creating wireless networks on chip and on system that simplify the interconnections between the various circuit blocks constituting the SoC (acronym of "System on Chip") and the SiP (acronym of "System in Package"), reducing for example the number of bumps, wire bonds and TSV that connect to each other the various blocks of the system itself.

In an embodiment, the wireless loopback test circuit facilitates increasing the level of standardization between the various systems and the various parts constituting them.

Some embodiments may take the form of computer program products. For example, according to one embodiment there is provided a computer readable medium comprising a computer program adapted to perform one or more of the methods described above. The medium may be a physical storage medium such as for example a Read Only Memory (ROM) chip, or a disk such as a Digital Versatile Disk (DVD-ROM), Compact Disk (CD-ROM), a hard disk, a memory, a network, or a portable media article to be read by an appropriate drive or via an appropriate connection, including as encoded in one or more barcodes or other related codes stored on one or more such computer-readable mediums and being readable by an appropriate reader device.

Furthermore, in some embodiments, some or all of the systems and/or modules may be implemented or provided in other manners, such as at least partially in firmware and/or hardware, including, but not limited to, one or more application-specific integrated circuits (ASICs), discrete circuitry, standard integrated circuits, controllers (e.g., by executing appropriate instructions, and including microcontrollers and/or embedded controllers), field-programmable gate arrays (FPGAs), complex programmable logic devices (CPLDs), etc., as well as devices that employ RFID technology. In some embodiments, some of the modules or controllers separately described herein may be combined, split into further modules and/or split and recombined in various manners.

The various embodiments described above can be combined to provide further embodiments. Aspects of the embodiments can be modified, if necessary to employ concepts of various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A wafer, comprising:
   a first integrated circuit, including:
      at least one test pad configured to couple to a testing device;
      a first embedded antenna coupled to the at least one test pad of the first integrated circuit; and
      a first test antenna to form a wireless link with the first embedded antenna in a test mode of operation;
   a second integrated circuit, including:
      at least one test pad configured to couple to the testing device;
      a second embedded antenna coupled to the at least one test pad of the second integrated circuit; and
      a second test antenna to form a wireless link with the second embedded antenna in the test mode of operation; and
   at least one network to form a wired link between the first test antenna of the first integrated circuit and the second test antenna of the second integrated circuit in the test mode of operation, wherein in the test mode of operation a communication link is formed between the at least one test pad of the first integrated circuit and the at least one test pad of the second integrated circuit by the wireless link between the first embedded antenna and the first test antenna, the wired link between the first test antenna and the second test antenna and the wireless link between the second test antenna and the second embedded antenna.

2. The wafer of claim 1, comprising a conductive layer above a passivation layer of said wafer, said conductive layer configured to form a closed loop surrounding said first and second embedded antennas.

3. The wafer of claim 2 wherein said conductive layer covers at least one of the first and second integrated circuits.

4. The wafer of claim 2 wherein said conductive layer is realized in part inside and in part outside at least one of the first and second integrated circuits.

5. The wafer of claim 1 wherein the at least one test pad of the first integrated circuit is configured to be contacted by at least one probe of the testing device.

6. The wafer of claim 1, comprising at least two test pads in a scribe line of separation of the first and second integrated circuits.

7. The wafer of claim 1 wherein the first and second embedded antennas each comprise a magnetic dipole and the first and second test antennas have a planar structure in a single level of conductive material that surrounds with a closed loop said first and second embedded antennas.

8. The wafer of claim 1 wherein the first and second embedded antennas each comprise a hertzian dipole, each embedded antenna being coupled to a respective receiver/transmitter, wherein said test antennas each have a hertzian dipole, facing a respective embedded antenna with hertzian dipole, and are coupled to at least one of a transmission line or circuit network.

9. The wafer of claim 1 wherein the first and second embedded antennas are of a capacitive type and the first and second test antennas comprise one strip of conductive material that overlaps at least in part onto said first and second embedded antennas of the capacitive type.

10. The wafer of claim 1 wherein the first and second embedded antennas are of a capacitive type and are above a passivation layer of said wafer, and the first and second test antennas comprise a strip of conductive material positioned so as not to overlap on the first and second embedded antennas and to be near enough to exploit edge capacitive effects.

11. The wafer of claim 1 wherein in the test mode of operation said first and second test antennas are configured to exchange radio frequency (RF) signals of an irradiated type, with said first and second embedded antennas, and to transmit RF signals on the wired link between the test antennas.

12. The wafer of claim 1 wherein the at least one network comprises an interface configured to couple to the first test antenna, an interface configured to couple to the second test antenna and a wired link crossing a scribe line of separation between the first integrated circuit and the second integrated circuit.

13. A testing device, comprising:
   a first test antenna configured to form a wireless loopback connection with a first embedded antenna of a semiconductor wafer to facilitate testing of the first embedded antenna by transforming an electromagnetic signal between the first test antenna and the first embedded antenna into an electrical signal; and
   a second test antenna configured to form a wireless loopback connection with a second embedded antenna of the semiconductor wafer to facilitate testing of the second embedded antenna by transforming an electromagnetic signal between the second test antenna and the second embedded antenna, wherein the first and second embedded antennas each comprise a magnetic dipole and the first and second test antennas have a planar structure in a single level of conductive material that surrounds with a closed loop said first and second embedded antennas.

14. The testing device of claim 13 wherein said first and second test antennas are configured to exchange radio frequency (RF) signals of an irradiated type, with said first and second embedded antennas, and to transmit RF signals inside the testing device between said test antennas.

15. The testing device of claim 13 wherein said first and second test antennas are interconnected through at least one transmission line or circuit network.

16. The testing device of claim 15 wherein said transmission line or circuit network crosses a scribe line of separation between a first and a second integrated circuit comprising said first and second embedded antennas.

17. The testing device of claim 13 comprising at least one first and one second pad in an area of one of a first and of a second integrated circuit comprising said first and second test antennas.

18. The testing device of claim 13 further comprising an ATE antenna configured to communicate with said test antennas.

19. The testing device of claim 18, comprising a supplementary antenna configured to communicate with said test antennas and with said ATE antenna.

20. The testing device of claim 18 wherein said ATE antenna is coupled to a transmitter having at least one of a core of magnetic material and a material with a high dielectric constant.

21. The testing device of claim 13 wherein the first and second test antenna are outside a wafer portion whereon a first and a second integrated circuit are integrated, said circuits comprising said first and second embedded antennas.

22. The testing device of claim 13 wherein the first and second antennas are housed in a probe card of said testing device.

23. The testing device of claim 22 wherein said probe card comprises said test antennas, which are coupled together through at least one of a transmission line and a circuit network and have respective cores of magnetic material or a material with a high dielectric constant.

24. The testing device of claim 23 wherein said probe card comprises a single test antenna configured to wirelessly couple with said first and second embedded antennas.

25. A testing device, comprising:
a first test antenna configured to form a wireless loopback connection with a first embedded antenna of a semiconductor wafer to facilitate testing of the first embedded antenna by transforming an electromagnetic signal between the first test antenna and the first embedded antenna into an electrical signal; and
a second test antenna configured to form a wireless loopback connection with a second embedded antenna of the semiconductor wafer to facilitate testing of the second embedded antenna by transforming an electromagnetic signal between the second test antenna and the second embedded antenna, wherein the first and second embedded antennas each comprise a hertzian dipole, each embedded antenna being coupled to a respective receiver/transmitter, wherein said test antennas each have a hertzian dipole, facing a respective embedded antenna with hertzian dipole, and are coupled to at least one of a transmission line or circuit network.

26. A testing device, comprising:
a first test antenna configured to form a wireless loopback connection with a first embedded antenna of a semiconductor wafer to facilitate testing of the first embedded antenna by transforming an electromagnetic signal between the first test antenna and the first embedded antenna into an electrical signal; and
a second test antenna configured to form a wireless loopback connection with a second embedded antenna of the semiconductor wafer to facilitate testing of the second embedded antenna by transforming an electromagnetic signal between the second test antenna and the second embedded antenna, wherein the first and second embedded antennas are of a capacitive type and the first and second test antennas comprise one strip of conductive material that overlaps at least in part onto said first and second embedded antennas of the capacitive type.

27. The testing device of claim 26 wherein the strip of conductive material is configured to form an ATE antenna with a magnetic dipole.

28. A testing device, comprising:
a first test antenna configured to form a wireless loopback connection with a first embedded antenna of a semiconductor wafer to facilitate testing of the first embedded antenna by transforming an electromagnetic signal between the first test antenna and the first embedded antenna into an electrical signal; and
a second test antenna configured to form a wireless loopback connection with a second embedded antenna of the semiconductor wafer to facilitate testing of the second embedded antenna by transforming an electromagnetic signal between the second test antenna and the second embedded antenna, wherein the first and second embedded antennas are of a capacitive type and are above a passivation layer of said wafer, and the first and second test antennas comprise a strip of conductive material positioned so as not to overlap on the first and second embedded antennas and to be near enough to exploit edge capacitive effects.

29. The testing device of claim 28 wherein the strip of conductive material is configured to form an ATE antenna with a magnetic dipole.

30. An integrated circuit, comprising:
at least one embedded antenna;
at least a residual portion of a first testing device configured to form a wireless loopback connection with the first embedded antenna to transform an electromagnetic signal between the first testing device and the first embedded antenna into an electrical signal, wherein said embedded antenna is of a capacitive type and said at least a residual portion of said testing device comprises at least a residual portion of a strip of conductive material coupled to a corresponding transceiver/transponder and configured to form a capacitive hertzian dipole.

31. The integrated circuit of claim 30 wherein said at least a residual portion of said first testing device comprises at least one pad configured to be used in successive processing steps after said integrated circuit is singled from a wafer.

32. The integrated circuit of claim 30 wherein said at least a residual portion comprises at least a residual portion of a strip of conductive material, the integrated circuit further comprising a ground plane configured to form a patch antenna with said at least a residual portion of said strip of conductive material.

33. The integrated circuit of claim 30 wherein the at least a residual portion comprises a first test antenna and a residual portion of a metallic path, the residual portion of the metallic path extending from the first test antenna up to a scribe line of said integrated circuit.

* * * * *